(12) United States Patent
Inada et al.

(10) Patent No.: US 11,852,534 B2
(45) Date of Patent: Dec. 26, 2023

(54) OPTICAL FILTER, LIGHT DETECTING DEVICE, AND LIGHT DETECTING SYSTEM

(71) Applicant: Panasonic Intellectual Property Management Co., Ltd., Osaka (JP)

(72) Inventors: Yasuhisa Inada, Osaka (JP); Atsushi Ishikawa, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 282 days.

(21) Appl. No.: 17/354,948

(22) Filed: Jun. 22, 2021

(65) Prior Publication Data

US 2021/0318171 A1 Oct. 14, 2021

Related U.S. Application Data

(63) Continuation of application No. PCT/JP2019/048471, filed on Dec. 11, 2019.

(30) Foreign Application Priority Data

Jan. 16, 2019 (JP) .................................. 2019-005568

(51) Int. Cl.
*G01J 3/28* (2006.01)
*G01J 3/12* (2006.01)
(Continued)

(52) U.S. Cl.
CPC .............. *G01J 3/2823* (2013.01); *G01J 3/12* (2013.01); *G02B 5/201* (2013.01); *G02B 5/288* (2013.01);
(Continued)

(58) Field of Classification Search
CPC .... G01J 3/2823; G01J 3/12; G01J 2003/1213; G01J 3/26; G01J 3/28; G02B 5/281;
(Continued)

(56) References Cited

U.S. PATENT DOCUMENTS 9,599,511 B2 * 3/2017 Ando ..................... G01J 3/28
11,631,164 B2 * 4/2023 McCall .................. G01J 3/36
(Continued)

FOREIGN PATENT DOCUMENTS

JP 2013-512445 4/2013
JP 2015-018232 1/2015
(Continued)

OTHER PUBLICATIONS

International Search Report of PCT application No. PCT/JP2019/048471 dated Mar. 10, 2020.
(Continued)

*Primary Examiner* — Marly S Camargo
(74) *Attorney, Agent, or Firm* — Rimon, P.C.

(57) ABSTRACT

An optical filter includes a filter array including filters two-dimensionally arrayed and a band-pass filter. The filters includes first and second filters. A transmission spectrum of each of the first and second filters has local maximum values of transmittance at three or more wavelengths included in a first wavelength region. The band-pass filter passes light in a second wavelength region including two or more wavelengths of the three or more wavelengths and not including one or more wavelengths of the three or more wavelengths. The filter array and the band-pass filter are disposed so that (a) the band-pass filter is located on an optical path of light that passes through the first and second filters or (b) the first and second filters are located on an optical path of light that passes through the band-pass filter.

18 Claims, 28 Drawing Sheets

(51) Int. Cl.
  *G02B 5/20* (2006.01)
  *G02B 5/28* (2006.01)
  *H04N 23/80* (2023.01)
  *H01L 27/146* (2006.01)
(52) U.S. Cl.
  CPC ...... *H04N 23/80* (2023.01); *G01J 2003/1213* (2013.01); *G01J 2003/2826* (2013.01)
(58) Field of Classification Search
  CPC ........ G02B 5/288; H04N 23/80; H04N 25/11; H01L 27/14621
  See application file for complete search history.

(56) References Cited

U.S. PATENT DOCUMENTS

| | | | |
|---|---|---|---|
| 2008/0042782 | A1 | 2/2008 | Wang et al. |
| 2012/0092666 | A1 | 4/2012 | Meijer et al. |
| 2014/0368825 | A1 | 12/2014 | Rissanen et al. |
| 2015/0271380 | A1* | 9/2015 | Darty ............... H04N 23/74 348/342 |
| 2016/0138975 | A1 | 5/2016 | Ando et al. |
| 2016/0172416 | A1* | 6/2016 | Hendrix ............ H01L 27/14621 438/59 |
| 2017/0005132 | A1 | 1/2017 | Vereecke et al. |
| 2017/0234726 | A1 | 8/2017 | Ockenfuss |
| 2022/0003907 | A1* | 1/2022 | Borremans ............ H04N 23/88 |
| 2023/0012033 | A1* | 1/2023 | Borreau ............ H01L 27/14621 |

FOREIGN PATENT DOCUMENTS

| | | |
|---|---|---|
| JP | 2015-501432 | 1/2015 |
| JP | 2017-168822 | 9/2017 |
| JP | 2018-066970 | 4/2018 |
| WO | 2011/064403 | 6/2011 |
| WO | 2013/064510 | 5/2013 |

OTHER PUBLICATIONS

The Extended European Search Report dated Jan. 26, 2022 for the related European Patent Application No. 19910551.1.
"Kim Cheolsun et al: ""Fabrication of 2Dthin-film filter-array for compressive sensing spectroscopy""", Optics and Lasers in Engineering, vol. 115, Nov. 24, 2018 (Nov. 24, 2018), pp. 53-58, XP055880705".
English Translation of Chinese Search Report dated Sep. 19, 2023 for the related Chinese Patent Application No. 201980081722.5.

* cited by examiner

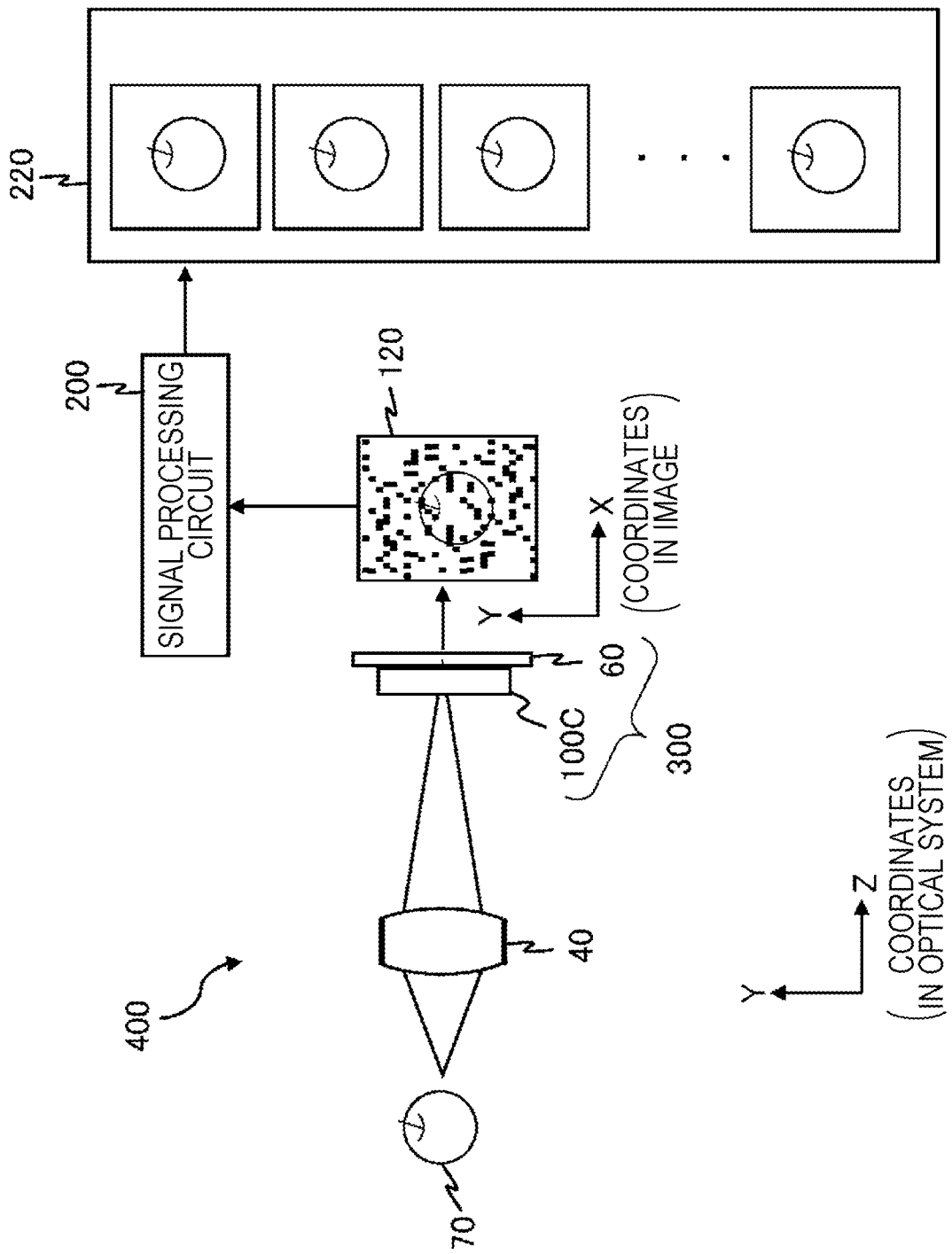

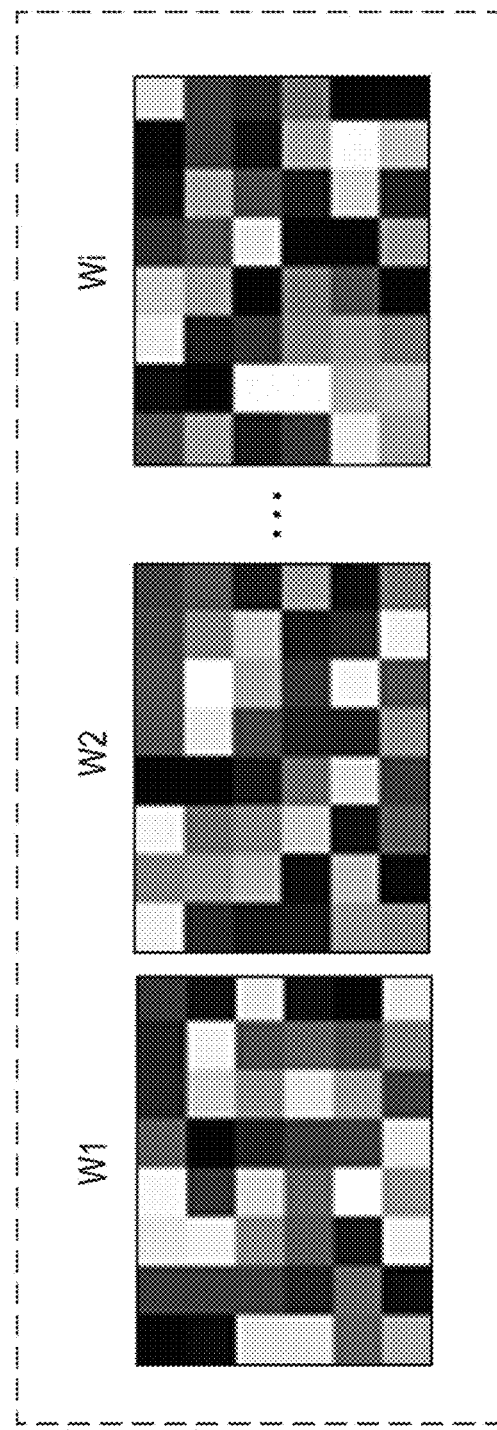

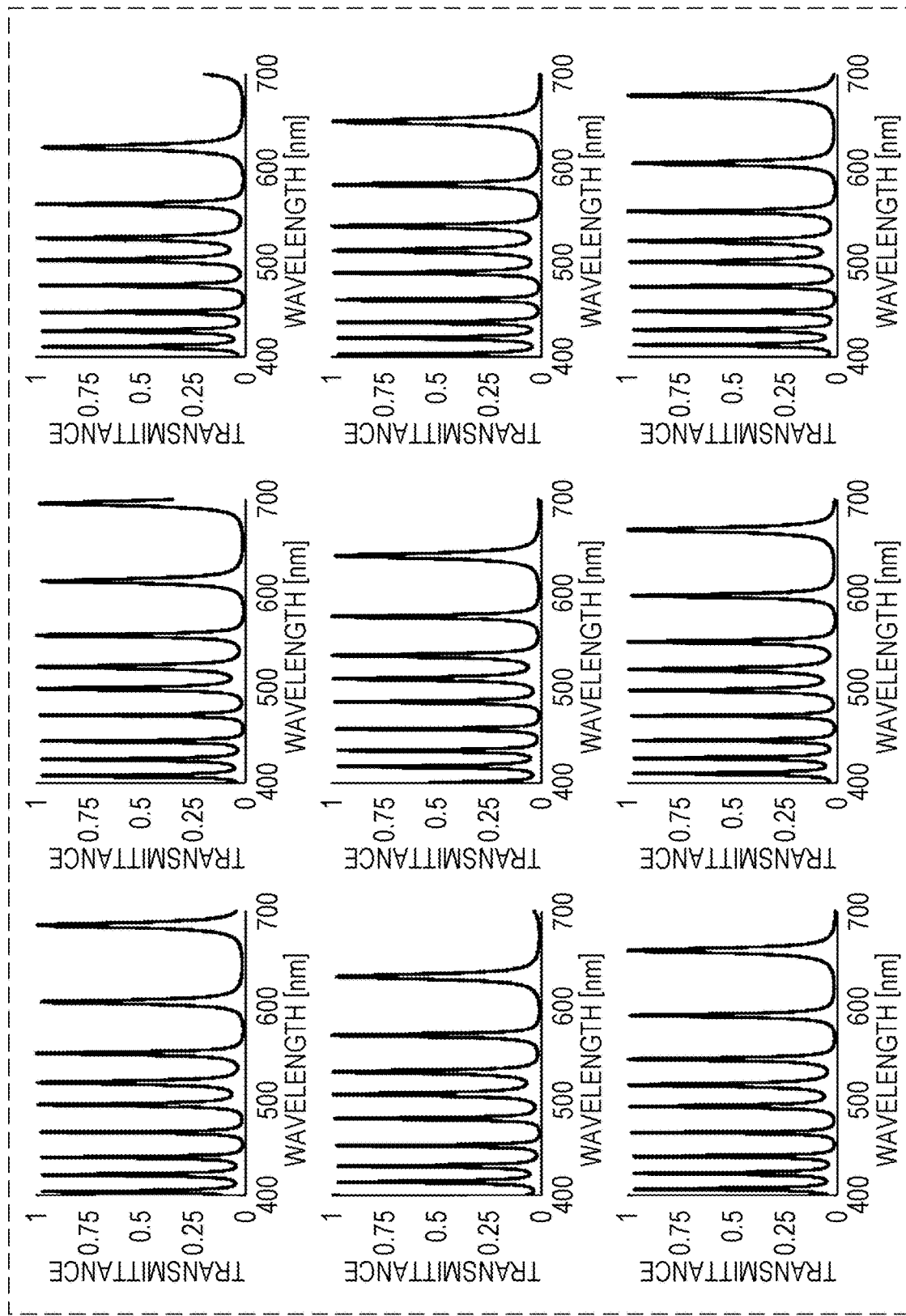

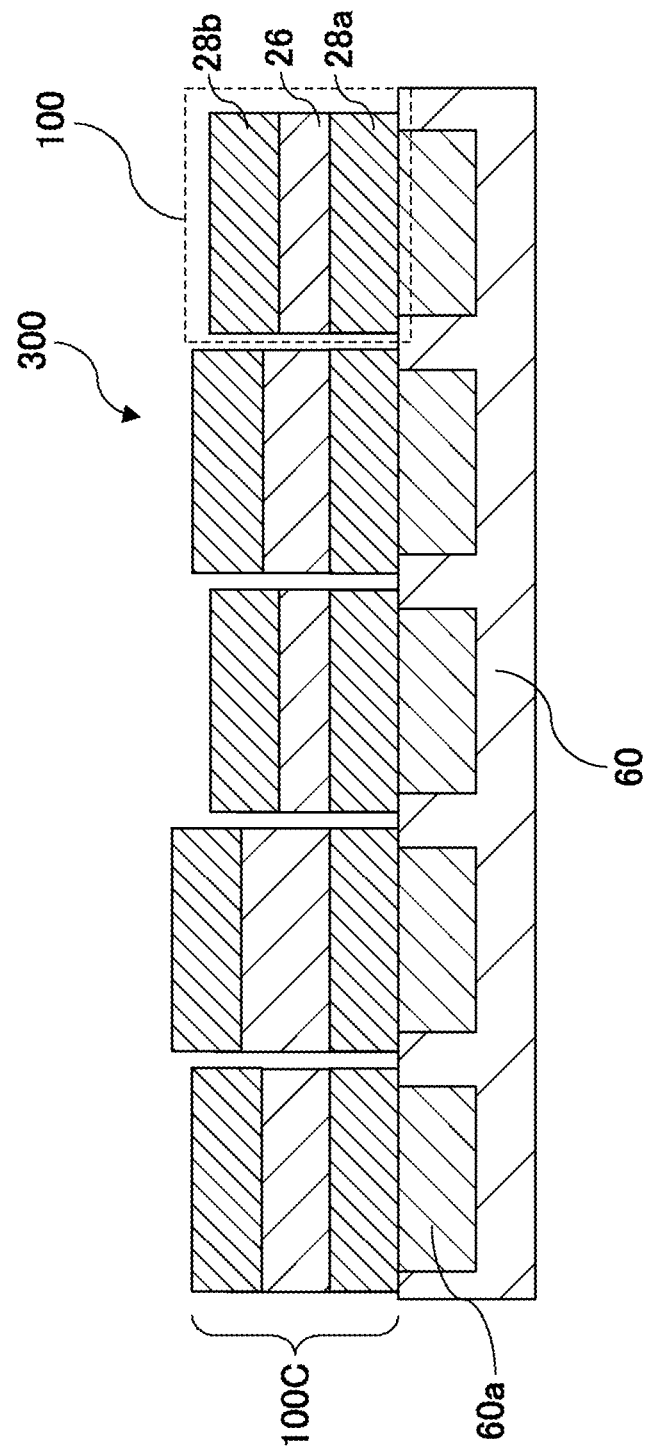

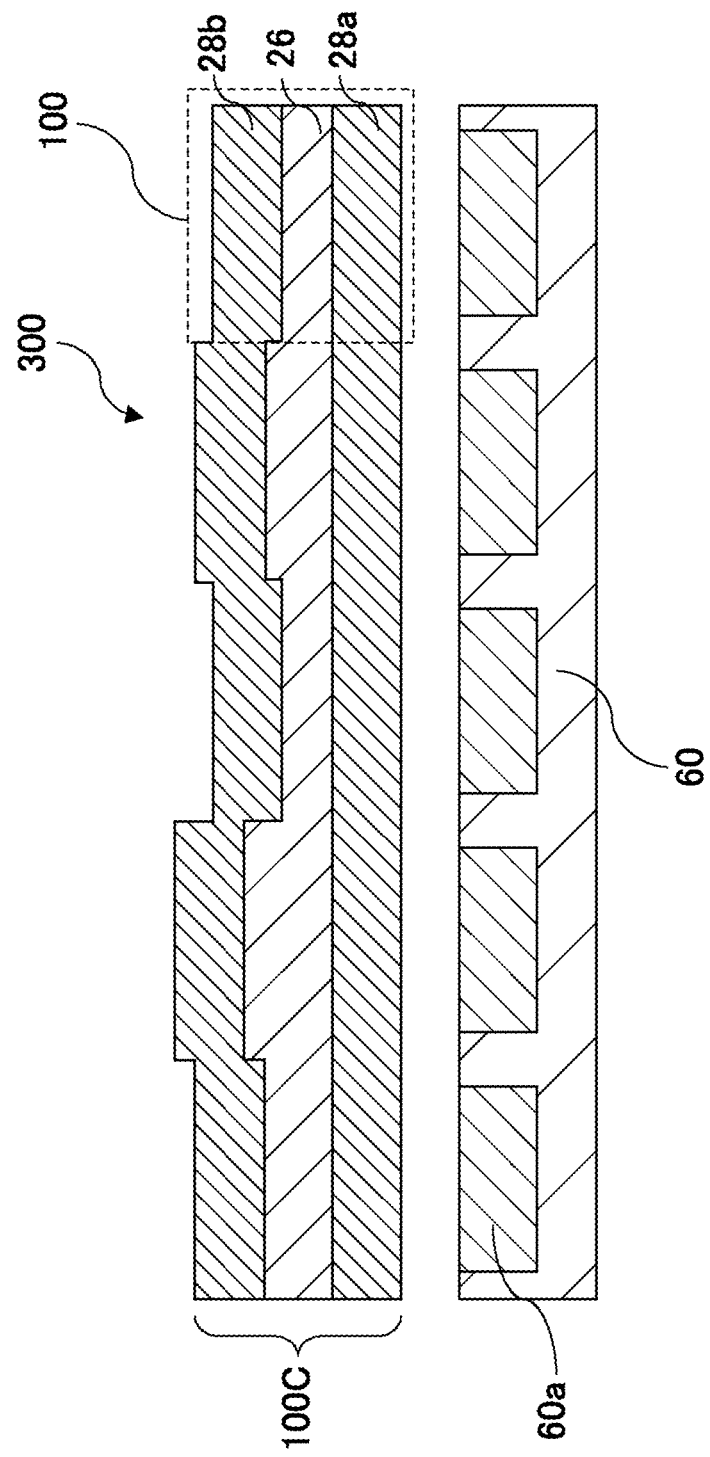

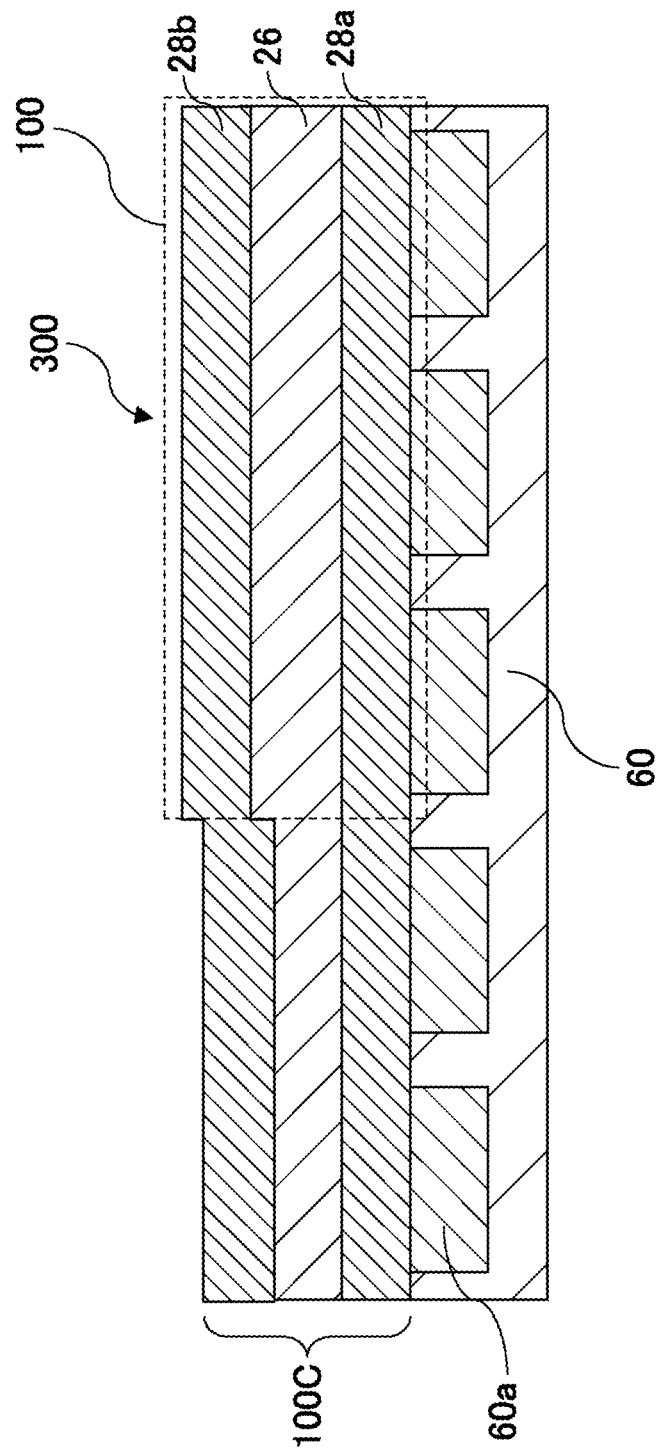

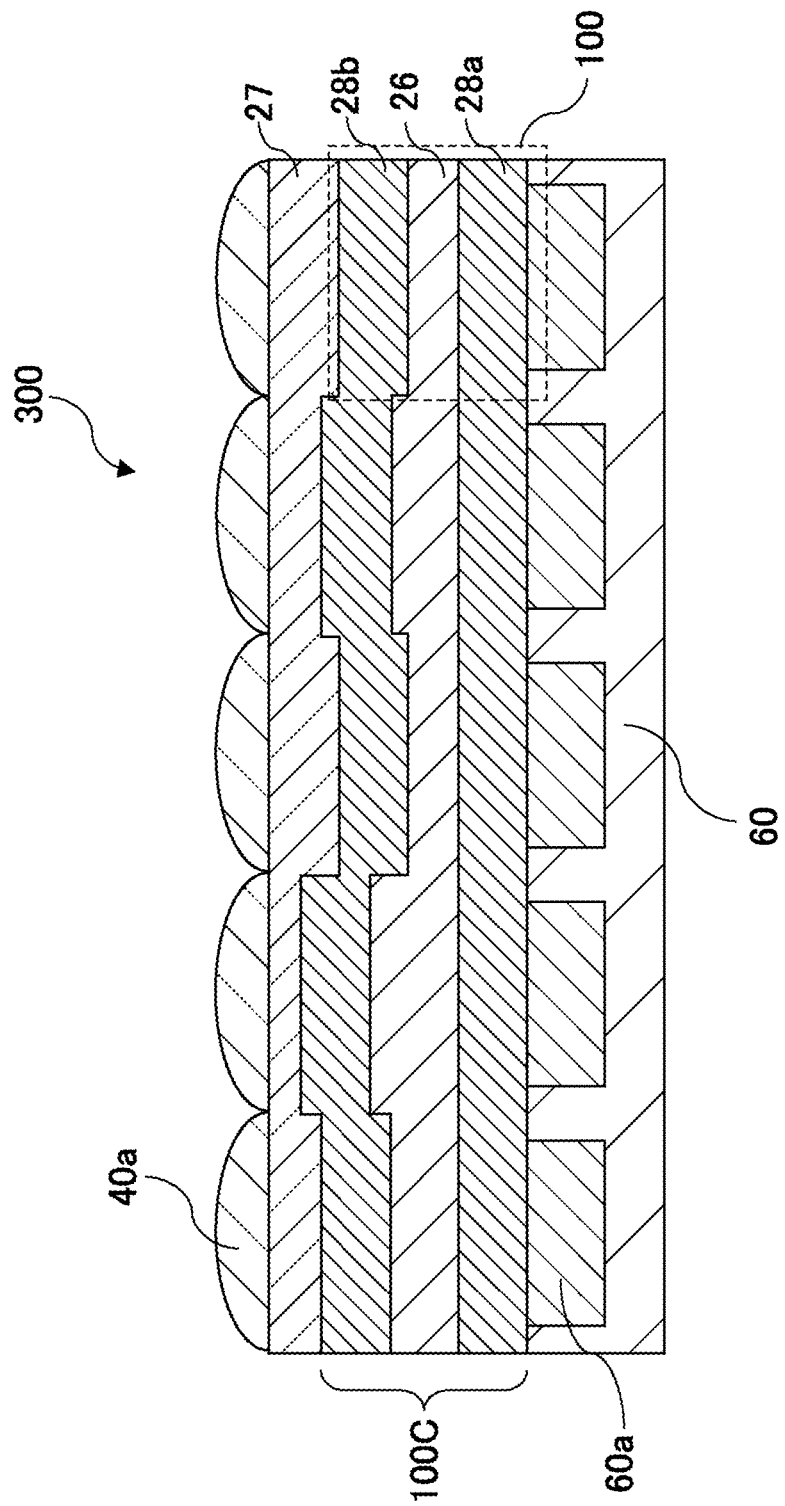

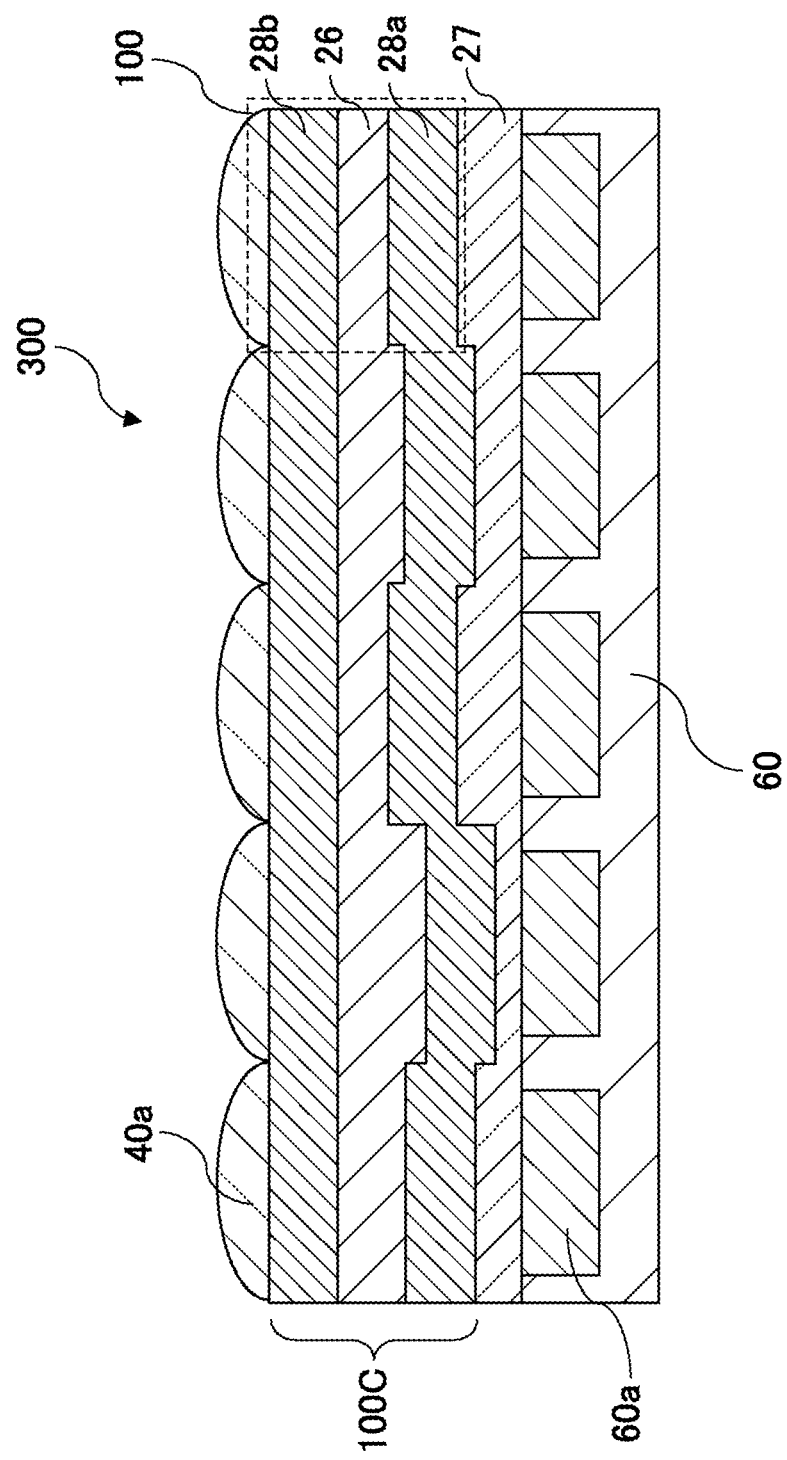

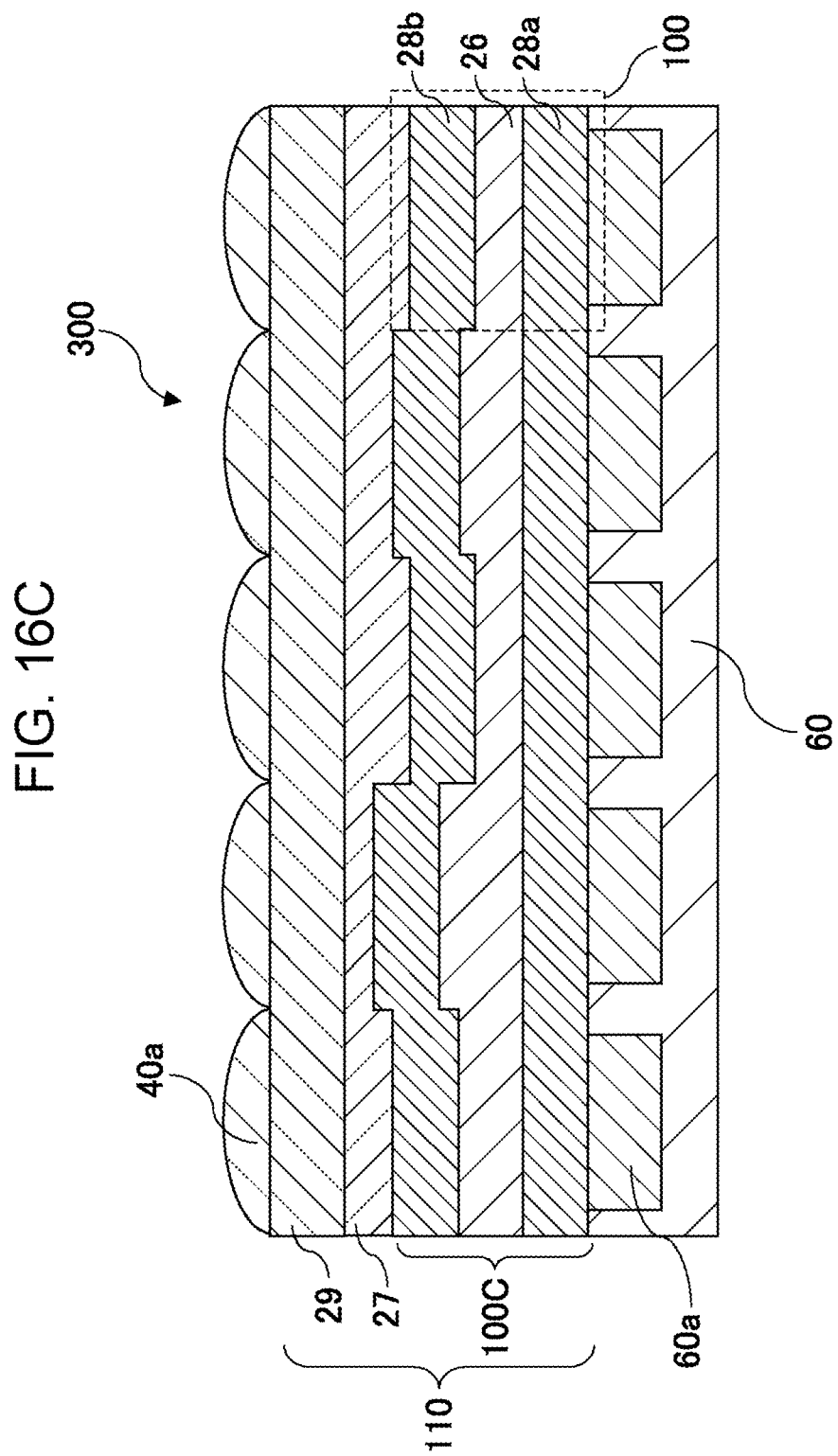

OPTICAL FILTER, LIGHT DETECTING DEVICE, AND LIGHT DETECTING SYSTEM

BACKGROUND

1. Technical Field

The present disclosure relates to an optical filter, a light detecting device, and a light detecting system.

2. Description of the Related Art

Utilizing spectral information of a large number of bands, for example, several tens of bands, each of which is a narrowband, makes it possible to determine detailed properties of a target object, the determination having been impossible with conventional RGB images. Cameras that acquire such multi-wavelength information are called "hyperspectral cameras". For example, as disclosed in U.S. Patent Application Publication No. 2016/138975, U.S. Pat. Nos. 7,907,340 and 9,929,206, Japanese Unexamined Patent Application Publication (Translation of PCT Application) No. 2013-512445, and Japanese Unexamined Patent Application Publication (Translation of PCT Application) No. 2015-501432, the hyperspectral cameras are utilized in various fields for food inspection, living-body examination, drug development, mineral component analysis, and so on.

SUMMARY

In one general aspect, the techniques disclosed here feature an optical filter including: a filter array including a plurality of filters two-dimensionally arrayed and a band-pass filter. The plurality of filters includes a first filter and a second filter. A transmission spectrum of each of the first filter and the second filter has local maximum values of transmittance at three or more wavelengths included in a first wavelength region. The band-pass filter passes light in a second wavelength region including two or more wavelengths of the three or more wavelengths and not including one or more wavelengths of the three or more wavelengths. The filter array and the band-pass filter are disposed so that (a) the band-pass filter is located on an optical path of transmitted light that passes through the first filter and the second filter or (b) the first filter and the second filter are located on an optical path of transmitted light that passes through the band-pass filter.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

BRIEF DESCRIPTION OF THE DRAWINGS

FIG. 1 is a diagram schematically showing a light detecting system in an exemplary embodiment;

FIG. 2B is a view showing one example of spatial distributions of transmittances of light in respective wavelength regions in a target wavelength region;

FIG. 8A includes graphs showing respective transmission spectra of nine types of multi-mode filter;

FIG. 12A is a view schematically showing a first modification of the light detecting device shown in FIG. 5;

FIG. 12C is a view schematically showing a third modification of the light detecting device shown in FIG. 5;

FIG. 12D is a view schematically showing a fourth modification of the light detecting device shown in FIG. 5;

FIG. 12E is a view schematically showing a fifth modification of the light detecting device shown in FIG. 5; and FIG. 12F is a view schematically showing a sixth modification of the light detecting device shown in FIG. 5;

FIG. 16C is a diagram schematically showing a third modification of the light detecting device shown in FIG. 13.

DETAILED DESCRIPTION

Figure 2A:
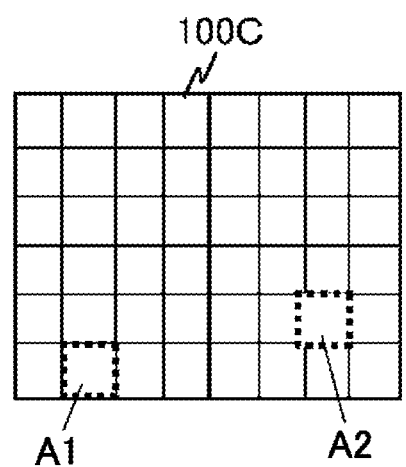
FIG. 2A is a view schematically showing an example of a filter array.

Before embodiments of the present disclosure are described, a description will be given of knowledge underlying the present disclosure.

U.S. Patent Application Publication No. 2016/138975 discloses an imaging device that can acquire a high-resolution multi-wavelength image. In the imaging device, an optical element called an "encoding element" encodes an optical image from a target object to perform imaging. The encoding element has a plurality of areas that is two-dimensionally arrayed. The transmission spectrum of each of at least two areas of the plurality of areas has local maximum values of transmittance in respective wavelength regions. The areas are disposed, for example, so as to respectively correspond to pixels of an image sensor. In imaging using the encoding element, data of each pixel includes information of a plurality of wavelength regions. That is, image data that is generated is data resulting from compression of wavelength information. Accordingly, it is sufficient to hold two-dimensional data, thus making it possible to reduce the amount of data. For example, even when the capacity of a recording medium has a constraint, it is possible to obtain data of long-term video.

The encoding element can be manufactured using various methods. For example, a method using organic material, such as dye or colorant, is conceivable. In this case, the areas in the encoding element are formed of light-absorbing materials having different light transmission characteristics. In such a structure, the number of manufacturing steps increases according to the number of types of light-absorbing material that are disposed. Thus, it is not easy to fabricate the encoding element using organic materials.

Meanwhile, U.S. Pat. Nos. 7,907,340, and 9,929,206, Japanese Unexamined Patent Application Publication (Translation of PCT Application) No. 2013-512445, and Japanese Unexamined Patent Application Publication (Translation of PCT Application) No. 2015-501432 disclose devices each including a plurality of Fabry-Perot filters having transmission spectra that are different from each other. Since Fabry-Perot filters allow transmittances to be controlled with the shape of the structure thereof, they can be more easily fabricated than organic material when a large number of different filters are prepared. However, in any of the examples disclosed in U.S. Pat. No. 7,907,340, and 9,929,206, Japanese Unexamined Patent Application Publication (Translation of PCT Application) No. 2013-512445, and Japanese Unexamined Patent Application Publication (Translation of PCT Application) No. 2015-501432, data of each pixel includes only information of a single wavelength region. Thus, in order to acquire a plurality of pieces of color information, it is necessary to use a number of pixels that is equal to the number of colors. Consequently, the spatial resolution is sacrificed.

Based on the consideration above, the present inventors have conceived an optical filter, a light detecting device, and a light detecting system recited in the following items.

(First Item)

An optical filter according to a first item includes a filter array including a plurality of filters two-dimensionally arrayed and a band-pass filter. The plurality of filters including a first filter and a second filter. A transmission spectrum of each of the first filter and the second filter has local maximum values of transmittance at three or more wavelengths included in a first wavelength region. The band-pass filter passes light in a second wavelength region including two or more wavelengths of the three or more wavelengths and not including one or more wavelengths of the three or more wavelengths. The filter array and the band-pass filter are disposed so that (a) the band-pass filter is located on an optical path of transmitted light that passes through the first filter and the second filter or (b) the first filter and the second filter are located on an optical path of transmitted light that passes through the band-pass filter.

This optical filter makes it possible to reduce the amount of time for a hyperspectral camera to obtain multi-wavelength information.

(Second Item)

In the optical filter according to the first item, each of the first filter and the second filter may include a first reflective layer, a second reflective layer, an intermediate layer between the first reflective layer and the second reflective layer and may have a resonance structure having a plurality of resonant modes whose orders are different from each other. At least one selected from the group consisting of a refractive index and a thickness of the intermediate layer in the first filter may differ from the at least one selected from the group consisting of a refractive index and a thickness of the intermediate layer in the second filter. In other words, a refractive index of the intermediate layer in the first filter may be different from a refractive index of the intermediate layer in the second filter and/or a thickness of the intermediate layer in the first filter may be different from a thickness of the intermediate layer in the second filter. The plurality of resonant modes may include three resonant modes. The three or more wavelengths may correspond to the three resonant modes, respectively. In other words, each of the three or more wavelengths may correspond to a corresponding one of the three resonant modes.

This optical filter provides an advantage that is the same as that of the optical filter according to the first item.

(Third Item)

In the optical filter according to the second item, each of the plurality of filters may have the resonance structure.

This optical filter provides an advantage that is the same as that of the optical filter according to the first or second item.

(Fourth Item)

In the optical filter according to one of the first to third items, the filter array may further include a transparent layer for planarizing a level difference between a surface of the first filter and a surface of the second filter.

In this optical filter, the transparent layer planarizes the level difference between the surface of the first filter and the surface of the second filter to thereby facilitate that another member is disposed on the transparent layer.

(Fifth Item)

In the optical filter according to one of the first to fourth items, at least one of the plurality of filters may be transparent.

This optical filter provides an advantage that is the same as that of the optical filter according to one of the first to fourth items.

(Sixth Item)

In the optical filter according to one of the first to fifth items, the plurality of filters may include a third filter that is different from the first filter and the second filter, and a transmission spectrum of the third filter may have one or more local maximum values of transmittance.

This optical filter provides an advantage that is the same as that of the optical filter according to one of the first to fifth items.

(Seventh Item)

In the optical filter according to one of the first to sixth items, the filter array may be separated from the band-pass filter.

This optical filter provides an advantage that is the same as that of the optical filter according to one of the first to sixth items.

(Eighth Item)

In the optical filter according to one of the first to sixth items, the filter array may be in contact with the band-pass filter.

This optical filter provides an advantage that is the same as that of the optical filter according to one of the first to sixth items.

(Ninth Item)

In the optical filter according to one of the first to eighth items, the band-pass filter may overlap the entire filter array when viewed in a direction orthogonal to the filter array.

This optical filter provides an advantage that is the same as that of the optical filter according to one of the first to eighth items.

(Tenth Item)

In the optical filter according to one of the first to ninth items, the one or more wavelengths not included in the second wavelength region may be located between a longest wavelength and a shortest wavelength of the two or more wavelengths included in the second wavelength region.

This optical filter provides an advantage that is the same as that of the optical filter according to one of the first to ninth items, even when the second wavelength region includes a plurality of discrete wavelength regions.

(11th Item)

A light detecting device according to an 11th item includes: an optical filter according to one of the first to tenth items; and an image sensor including a plurality of light detection elements, each having sensitivity to light in the first wavelength region.

In this light detecting device, the image sensor can detect light components that are included in the first wavelength region and from which light components other than the second wavelength region are eliminated by the optical filter.

(12th Item)

In the light detecting device according to the 11th item, the optical filter may be in contact with the image sensor.

This light detecting device provides an advantage that is the same as that of the light detecting device according to the 11th item.

(13th Item)

In the light detecting device according to the 11th item, the optical filter may be separated from the image sensor.

This light detecting device provides an advantage that is the same as that of the light detecting device according to the 11th item. The light detecting device according to the 11th item may further comprise optical system including at least one lens. The optical system, the optical filter and the image sensor may be arranged in this order such that light enters from the optical system toward the image sensor.

(14th Item)

A light detecting system according to a 14th item includes: the light detecting device according to one of the 11th to 13th items; and a signal processing circuit. Based on a signal output from the image sensor, the signal processing circuit generates and outputs image data including information of a plurality of wavelengths included in the second wavelength region.

This light detecting system can generate and output image data including information of a plurality of wavelengths included in the second wavelength region.

(15th Item)

In the light detecting system according to the 14th item, the image data may include data representing images spectrally separated for the plurality of wavelengths.

In this light detecting system, image data including data representing images spectrally separated for the respective wavelengths.

(16th Item)

In the light detecting system according to the 15th item, the number of picture elements included in each of the images may be larger than M/N, where N represents the number of images, and M represents the number of light detection elements.

This light detecting system makes it possible to suppress a reduction in the resolution of each of the plurality of images.

(17th Item)

In the light detecting system according to the 16th item, the number of picture elements may be equal to the number of light detection elements.

This light detecting system can provide an advantage that is the same as that of the 16th item.

In the present disclosure, all or a part of circuits, units, devices, members, or portions or all or a part of functional blocks in the block diagrams can be implemented by, for example, one or more electronic circuits including a semiconductor device, a semiconductor integrated circuit (IC), or a large-scale integration (LSI). The LSI or IC may be integrated into one chip or may be constituted by combining a plurality of chips. For example, functional blocks other than a storage element may be integrated into one chip. Although the name used here is an LSI or IC, it may also be called a system LSI, a very large scale integration (VLSI), or an ultra large scale integration (ULSI) depending on the degree of integration. A field programmable gate array (FPGA) that can be programmed after manufacturing an LSI or a reconfigurable logic device that allows reconfiguration of the connection relationship or setup of circuit cells inside the LSI can also be used for the same purpose.

In addition, functions or operations of all or a part of circuits, units, devices, members, or portions can be executed by software processing. In this case, the software is recorded on one or more non-transitory recording media, such as a ROM, an optical disk, or a hard disk drive, and when the software is executed by a processing device (a processor), the processing device (the processor) and peripheral devices execute the functions specified by the software. A system or a device may include one or more non-transitory recording media on which the software is recorded, a processing device (a processor), and necessary hardware devices, for example, an interface.

More specific embodiments of the present disclosure will be described below with reference to the accompanying drawings. However, an overly detailed description may be omitted. For example, a detailed description of already well-known things and a redundant description of substantially the same configurations may be omitted herein. This is to avoid the following description becoming overly redundant and to facilitate understanding of those skilled in the art. The inventors provide the accompanying drawings and the following description in order for those skilled in the art to fully understand the present disclosure, and these drawings and description are not intended to limit the subject matter as recited in the claims. In the following description, the same or similar constituent elements are denoted by the same reference numerals.

Embodiments

<Light Detecting System>

First, a light detecting system in the present embodiment will be described.

FIG. 1 is a diagram schematically showing a light detecting system 400 in an exemplary embodiment. The light detecting system 400 includes an optical system 40, a filter array 100C, an image sensor 60, and a signal processing circuit 200. The filter array 100C has functions that are similar to those of the "encoding element" disclosed in U.S. Patent Application Publication No. 2016/138975. Thus, the filter array 100C can also be referred to as an "encoding element". The optical system 40 and the filter array 100C are disposed on an optical path of light that is incident from a target object 70.

The filter array 100C includes a plurality of light-transmissive areas arrayed in a row or column. The filter array 100C is an optical element in which the light transmission spectrum, that is, the wavelength dependency of the light transmittance, differs depending on the area. The filter array 100C modulates the intensity of incident light and passes the modulated incident light. The filter array 100C may be disposed in the vicinity of or directly above the image sensor 60. The "vicinity" as used herein means being in close proximity to a degree that an optical image from the optical system 40 is formed on a plane of the filter array 100C in a clear state to some degree. The "directly above" means that both are in close proximity to each other to a degree that almost no gap occurs therebetween. The filter array 100C and the image sensor 60 may be integrated together. A device including the filter array 100C and the image sensor 60 is referred to as a "light detecting device 300".

The optical system 40 includes at least one lens. Although the optical system 40 is shown as one lens in FIG. 1, the optical system 40 may be constituted by a combination of a plurality of lens. The optical system 40 forms an image on an imaging plane of the image sensor 60 via the filter array 100C.

Based on an image 120 acquired by the image sensor 60, the signal processing circuit 200 reconstructs a plurality of separate images 220 including multi-wavelength information. Details of the plurality of separate images 220 and a processing method for image signals in the signal processing circuit 200 are described later. The signal processing circuit 200 may be incorporated into the light detecting device 300 or may be a constituent element of a signal processing device electrically connected to the light detecting device 300 by wire or wirelessly.

<Filter Array>

The filter array 100C in the present embodiment will be described below. The filter array 100C is used in a spectroscopy system that generates images for respective wavelength regions included in a wavelength region to be imaged. Herein, the wavelength region to be imaged may be referred to as a "target wavelength region". The filter array 100C is disposed on an optical path of light that is incident from a target object, modulates the intensity of the incident light for respective wavelengths, and outputs the modulated light. This process involving the filter array 100C, that is, the encoding element, is herein referred to as "encoding".

FIG. 2A is a view schematically showing an example of the filter array 100C. The filter array 100C has a plurality of areas that is two-dimensionally arrayed. The areas may herein be referred to as "cells". A filter having a transmission spectrum that is individually set is disposed in each area. The transmission spectrum is represented by a function T(X), where X is the wavelength of incident light. The transmission spectrum T(X) can take a value that is greater than or equal to 0 and is less than or equal to 1. Details of the configuration of the filters are described below.

In the example shown in FIG. 2A, the filter array 100C has 48 rectangular areas arrayed in six rows by eight columns. This is merely exemplary, and a larger number of areas than that number can be provided in actual applications. The number of areas can be, for example, approximately the same as the number of pixels in a typical photodetector, such as an image sensor. The number of pixels is, for example, a few hundred thousand to tens of millions. In one example, the filter array 100C may be disposed directly above a photodetector, and each area may be disposed so as to correspond to one pixel in the photodetector. Each area faces, for example, one pixel in the photodetector.

FIG. 2B is a view showing one example of spatial distributions of transmittances of light in respective wavelength regions W1, W2, . . . , and Wi included in a target wavelength region. In the example shown in FIG. 2B, differences in darkness/lightness in the areas represent differences in the transmittances. The lighter the area is, the higher the transmittance is, and the darker the area is, the lower the transmittance is. As shown in FIG. 2B, the spatial distribution of the light transmittances differs depending on the wavelength region.

Figure 2C:
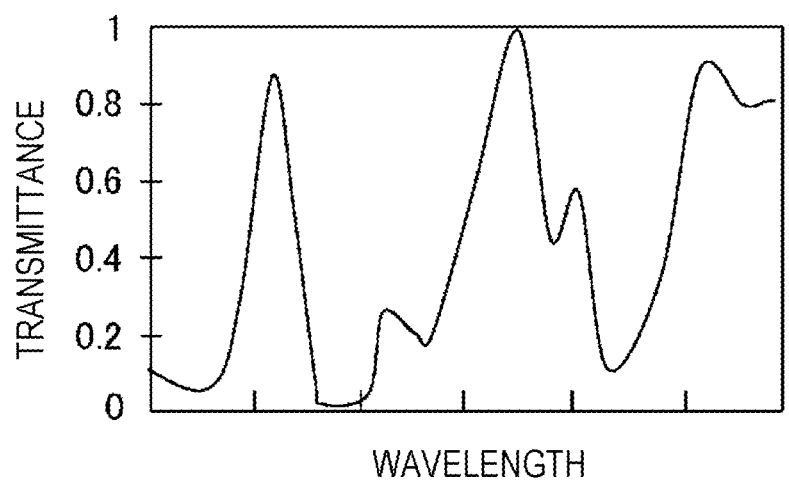
FIG. 2C is a graph showing an example of a transmission spectrum of one of two areas included in a plurality of areas in the filter array shown in FIG. 2A.
Figure 2D:
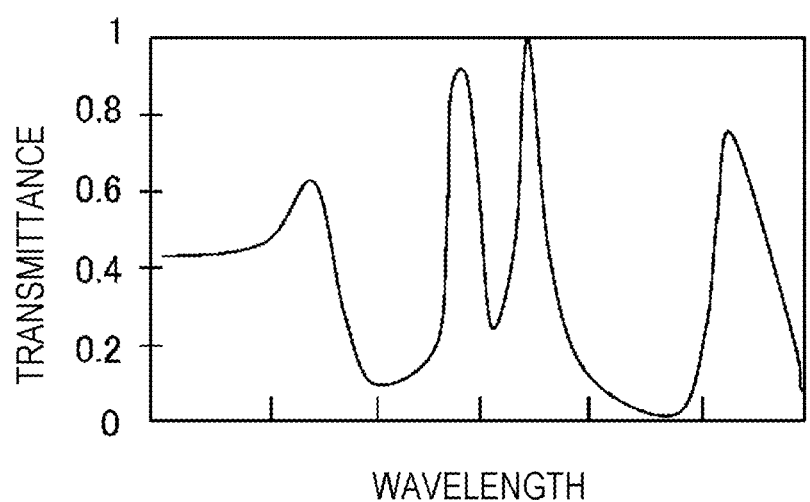
FIG. 2D is a graph showing an example of a transmission spectrum of the other of the two areas included in the plurality of areas in the filter array shown in FIG. 2A.

FIG. 2C and FIG. 2D are graphs showing examples of transmission spectra in area A1 and area A2, respectively, included in the areas in the filter array 100C shown in FIG. 2A. The transmission spectrum in area A1 and the transmission spectrum in area A2 differ from each other. Thus, the transmission spectrum of the filter array 100C differs depending on the area. However, the transmission spectra in all the areas do not necessarily have to differ from each other. In the filter array 100C, the transmission spectra of at least some of the areas are different from each other. The at least some of the areas are two or more areas. That is, the filter array 100C includes two or more filters whose transmission spectra are different from each other. In one example, the number of patterns of the transmission spectra of the areas included in the filter array 100C can be greater than or equal to the number i of wavelength regions included in the target wavelength region. The filter array 100C may be designed such that the transmission spectra of more than half of the areas are different.

Figure 3A:
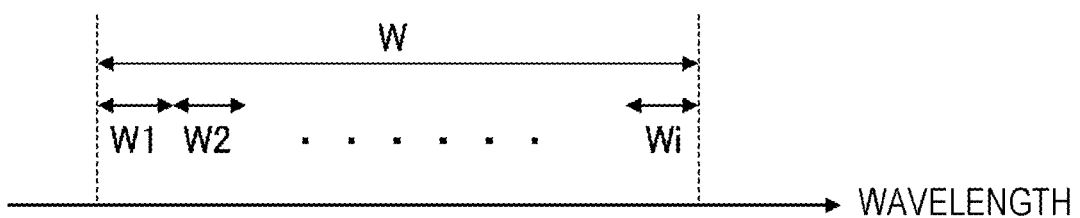
FIG. 3A is a diagram for describing a relationship between the target wavelength region and a plurality of wavelength regions included therein.
Figure 3B:
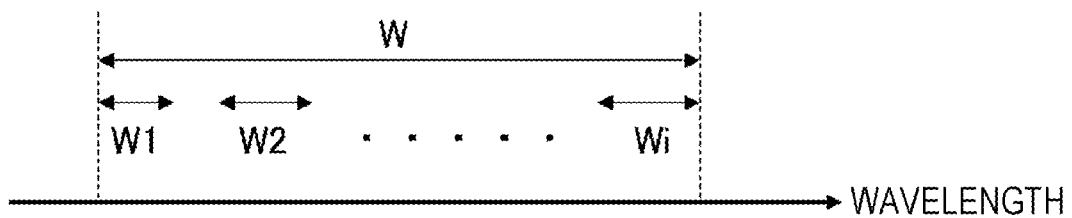
FIG. 3B is a diagram for describing a relationship between the target wavelength region and the plurality of wavelength regions included therein.

FIGS. 3A and 3B are diagrams for describing a relationship between a target wavelength region W and the wavelength regions W1, W2, . . . , and Wi included therein. The target wavelength region W can be set to various ranges, depending on the application. The target wavelength region W can be, for example, a visible-light wavelength region of about 400 nm to about 700 nm, a near-infrared wavelength region of about 700 nm to about 2500 nm, and a near-ultraviolet wavelength region of about 10 nm to about 400 nm, or radio wave ranges of mid infrared, far infrared, terahertz waves, millimeter waves, or the like. Thus, the wavelength region that is used is not limited to a visible light region. Herein, not only visible light but also non-visible light, such as near-ultraviolet, near-infrared, and radio waves, is referred to as "light", for the sake of convenience".

In the example shown in FIG. 3A, i wavelength regions obtained by equally dividing the target wavelength region W are referred to as "wavelength regions W1, W2, . . . , and Wi", where i is an arbitrary integer greater than or equal to 4. However, the present disclosure is not limited to such an example. The plurality of wavelength regions included in the target wavelength region W may be arbitrarily set. For example, the bandwidths may be made unequal depending on the wavelength region. A gap may be present between the adjacent wavelength regions. In the example shown in FIG. 3B, the bandwidth differs depending on the wavelength region, and a gap exists between two adjacent wavelength regions. In such a manner, it is sufficient as long as the wavelength regions be different from each other, and how they are determined is arbitrary. The number i of divided wavelengths may be less than or equal to 3.

Figure 4A:
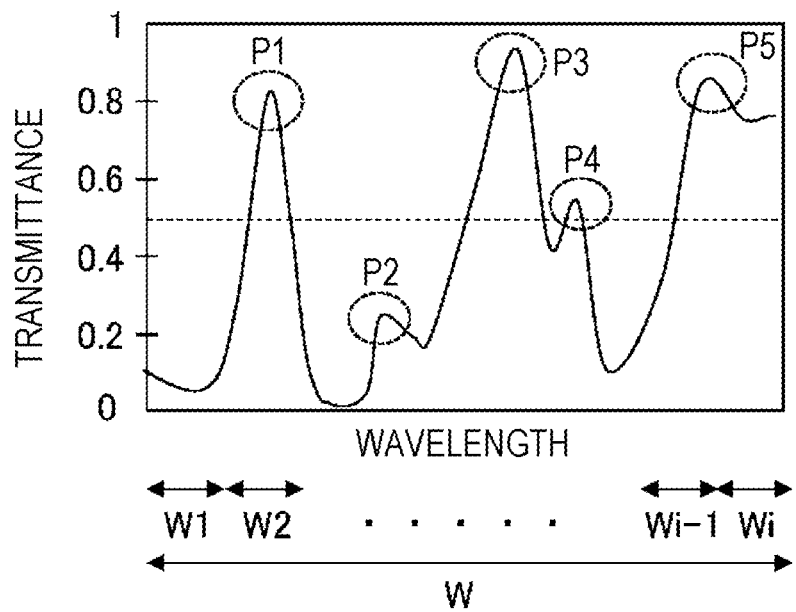
FIG. 4A is a graph for describing characteristics of a transmission spectrum in a certain area in the filter array.

FIG. 4A is a graph for describing characteristics of a transmission spectrum in a certain area in the filter array 100C. In the example shown in FIG. 4A, the transmission spectrum has a plurality of local maximum values P1 to P5 and a plurality of local minimum values with respect to the wavelengths in the target wavelength region W. In the example shown in FIG. 4A, normalization is performed so that the maximum value of the light transmittance in the target wavelength region W is 1, and the minimum value thereof is 0. In the example shown in FIG. 4A, the transmission spectrum has the local maximum values in wavelength regions, such as wavelength regions W2 and Wi−1. Thus, in the present embodiment, the transmission spectrum in each area has the local maximum values at at least two wavelengths of the wavelength regions W1 to Wi. As can be seen from FIG. 4A, the local maximum values P1, P3, P4, and P5 are greater than or equal to 0.5.

As described above, the light transmittance in each area differs depending on the wavelength. Thus, the filter array 100C passes a large amount of components in one wavelength region of incident light and does not pass much components in other wavelength regions of the incident light. For example, the transmittances for light in k wavelength regions of the i wavelength regions can be larger than 0.5, and the transmittances for light in the remaining i-k wavelength regions can be smaller than 0.5, where k is an integer that satisfies 2≤k<i. If incident light is white light equally including wavelength components of all visible light, the filter array 100C modulates, for each area, the incident light into light having a plurality of discrete intensity peaks with respect to the wavelength, superimposes the light having multi wavelengths, and outputs the light.

Figure 4B:
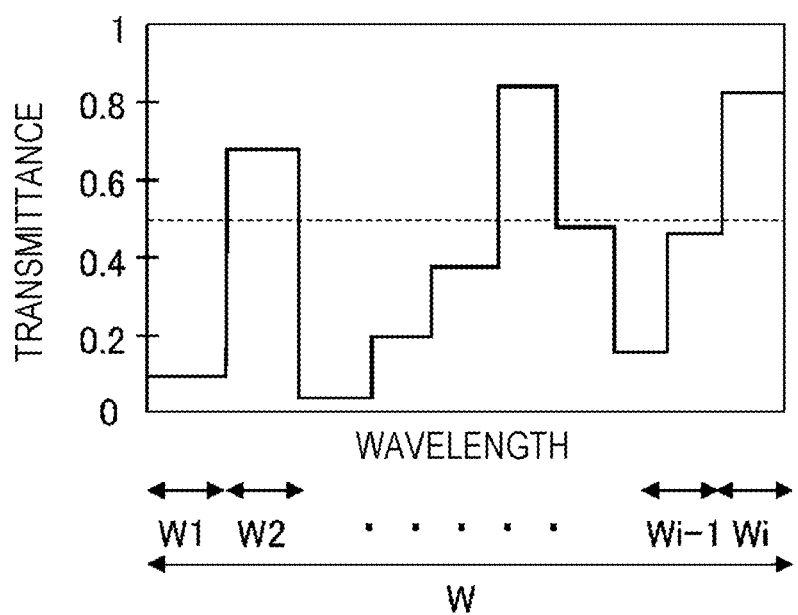
FIG. 4B is graph showing a result of averaging the transmission spectra for each of the wavelength regions shown in FIG. 4A.

FIG. 4B is a graph showing one example of a result of averaging the transmittances shown in FIG. 4A for each of wavelength regions W1, W2, . . . , and Wi. The averaged transmittance is obtained by integrating the transmission spectrum T(λ) for each wavelength region and dividing the result thereof by the bandwidth of the wavelength region. The value of the transmittance averaged for each wavelength region in such a manner will herein be referred to as a "transmittance" in the wavelength region. In this example, in three wavelength regions in which the local maximum values P1, P3, and P5 are reached, the transmittances are prominently high. In particular, in two wavelength regions where the local maximum values P3 and P5 are reached, the transmittances exceed 0.8.

The resolution in a wavelength direction of the transmission spectrum in each area can be set to approximately the bandwidth of a desired wavelength region. In other words, in a wavelength range including one local maximum value on a transmission spectrum curve, the width of a range that takes values that are greater than or equal to the average value of the local maximum value and a local minimum value that is the most adjacent to the local maximum value can be set to approximately the bandwidth of a desired wavelength region. In this case, when the transmission spectrum is resolved into frequency components, for example, by a Fourier transform, the values of frequency components corresponding to the wavelength region increase relatively.

The filter array 100C is typically divided into a plurality of cells sectioned into a lattice form, as shown in FIG. 2A. These cells have transmission spectra that are different from each other. The wavelength distribution and the spatial distribution of the light transmittances of the areas in the filter array 100C can be, for example, random distributions or pseudo-random distributions.

The concepts of the random distribution and the pseudo-random distribution are as follows. First, each area in the filter array 100C can be regarded as, for example, a vector element having a value of 0 to 1 according to the light transmittance. In this case, when the transmittance is 0, the value of the vector element is 0, and when the transmittance is 1, the value of the vector element is 1. In other words, a collection of areas that are arranged in one line in a row direction or a column direction can be regarded as a multi-dimensional vector having values of 0 to 1. Accordingly, the filter array 100C can be said to include a plurality of multidimensional vectors in the column direction or the row direction. In this case, the random distribution means that two arbitrary multidimensional vectors are independent from each other, that is, are not parallel to each other. Also, the pseudo-random distribution means that a non-independent configuration is included between some multidimensional vectors. Accordingly, in the random distribution and the pseudo-random distribution, a vector whose elements are the values of the transmittances of light in a first wavelength region in the areas belonging to a collection of the areas arranged in one row or column included in the plurality of areas and a vector whose elements are the values of the transmittances of light in the first wavelength region in the areas belonging to a collection of the areas arranged in another row or column are independent from each other. In a second wavelength region that is different from the first wavelength region, similarly, a vector whose elements are the values of the transmittances of light in the second wavelength region in the areas belonging to a collection of the areas arranged in one row or column included in the plurality of areas and a vector whose elements are the values of the transmittances of light in the second wavelength region in the areas belonging to a collection of the areas arranged in another row or column are intendent from each other.

When the filter array 100C is disposed in the vicinity of or directly above the image sensor 60, a cell pitch, which is the interval between the areas in the filter array 100C, may be made to generally match the pixel pitch of the image sensor 60. With this arrangement, the resolution of an encoded optical image emitted from the filter array 100C generally matches the resolution of the pixels. When light that passes through each cell is adapted to be incident on only one corresponding pixel, it is possible to easily perform an arithmetic operation described below. When the filter array 100C is disposed away from the image sensor 60, the cell pitch may be reduced according to the distance therebetween.

In the example shown in FIGS. 2A to 2D, a grayscale transmittance distribution in which the transmittance of each area can take a value that is greater than or equal to 0 and is less than or equal to 1 is envisaged. However, the transmittance distribution does not necessarily have to be made to be a grayscale transmittance distribution. For example, a binary-scale transmittance distribution in which the transmittance of each area can take a value of either generally 0 or generally 1 may be employed. In the binary-scale transmittance distribution, each area passes a majority of light in at least two wavelength regions of wavelength regions included in the target wavelength region and does not pass a majority of light in the remaining wavelength regions. The "majority" herein refers to about 80% or more.

Some of all the cells, for example, half of the cells, may be replaced with transparent areas. Such transparent areas pass light in all the wavelength regions W1 to Wi included in the target wavelength region at approximately the same high transmittance. The high transmittance is, for example, greater than or equal to 0.8. In such a configuration, the transparent areas can be disposed, for example, in a checkered pattern. That is, in two array directions of the areas in the filter array 100C, the area in which the light transmittance differs depending on the wavelength and the transparent area can be alternately arrayed. In the example shown in FIG. 2A, the two array directions are a horizontal direction and a vertical direction.

<Signal Processing Circuit>

Next, a description will be given of a method in which the signal processing circuit 200 shown in FIG. 1 reconstructs multi-wavelength separate images 220 based on the image 120 and spatial distribution characteristics of transmittances for respective wavelengths in the filter array 100C. The "multi wavelengths" as used herein means a larger number of wavelength regions than the wavelength regions in three colors of RGB obtained by, for example, an ordinary color camera. The number of wavelength regions can be, for example, about 4 to 100. The number of wavelength regions may be referred to as the "number of spectral bands". The number of spectral bands may exceed 100, depending on the application.

Data to be acquired are separate images 220, and the data are represented as f. When the number of spectral bands is represented as w, f is data obtained by integrating pieces of image data $f_1, f_2, \ldots,$ and $f_w$ in the individual bands. When the number of picture elements in an x-direction of the image data to be acquired is represented as n, and the number of picture elements in a y-direction thereof is represented as m, each of the pieces of image data $f_1, f_2, \ldots,$ and $f_w$ is a collection of pieces of two-dimensional data for n×m picture elements. Accordingly, the data f is three-dimensional data in which the number of elements is n×m×w. Meanwhile, the number of elements in data g of the image 120 acquired through encoding and multiplexing performed by the filter array 100C is n×m. The data g in the present embodiment can be given by expression (1):

$$g = Hf = H \begin{bmatrix} f_1 \\ f_2 \\ \vdots \\ f_w \end{bmatrix} \quad (1)$$

In this case, $f_1, f_2, \ldots f_w$ are each a piece of data having n×m elements. Thus, the vector on the right-hand side is, strictly speaking, a one-dimensional vector for n×m×w rows by one column. The vector g is converted into and expressed by a one-dimensional vector for n×m rows by one column, and the one-dimensional vector is calculated. A matrix H represents conversion for encoding and intensity-modulating the components $f_1, f_2, \ldots,$ and $f_w$ of the vector f with pieces of encoding information that are different for each wavelength region and adding resulting components. Thus, H is a matrix with n×m rows by n×m×w columns.

When the vector g and the matrix H are given, it seems that f can be determined by solving an inverse problem of expression (1). However, since the number n×m×w of elements in the data f to be determined is larger than the number n×m of elements in the acquired data g, this problem is an ill-posed problem and cannot be directly solved. Hence, the signal processing circuit 200 in the present embodiment utilizes redundancy of images included in the data f to determine the solution by using a scheme for compressive sensing. Specifically, the data f to be determined is estimated by solving expression (2):

$$f' = \underset{f}{\mathrm{argmin}}\{\|g - Hf\|_{l_2} + \tau \Phi(f)\} \quad (2)$$

In this case, f' represents data of estimated f. The first term in the braces in the above equation represents the amount of deviation between an estimation result Hf and the acquired data g, that is, the so-called residual term. Although the sum of squares is used as the residual term, an absolute value, the square root of the sum of squares, or the like may be used as the residual term. The second term in the braces is a regularization term or a stabilization term described below. Expression (2) means determining f that minimizes the sum of the first term and the second term. The signal processing circuit 200 can calculate the final solution f' by converging solutions through a recursive iteration arithmetic operation.

The first term in the braces in expression (2) means an arithmetic operation for determining the sum of squares of differences between the acquired data g and Hf obtained by system-converting f in an estimation process by using the matrix H. $\Phi(f)$ in the second term is a constraint condition in regularization of f and is a function that reflects sparse information of the estimated data. ΦM serves to provide an effect of smoothing or stabilizing the estimated data. The regularization term can be represented by, for example, a discrete cosine transform (DCT), a wavelet transform, a Fourier transform, total variation (TV), or the like of f. For example, when total variation is used, it is possible to acquire stable estimated data with reduced influences of noise in the observed data Φ(f). The sparseness of the target object 70 in the space of each regularization term differs depending on the texture of the target object 70. A regularization term with which the texture of the target object 70 becomes sparser in the space of the regularization term may be selected. Alternatively, the arithmetic operation may include a plurality of regularization terms. As a weighting factor τ increases, the amount of reduction in redundant data increases, and the rate of compression increases. In expression (2), τ is a weighting factor. As the weighting factor τ decreases, the convergence to the solution becomes weak. The weighting factor τ is set to an appropriate value at which f converges to some degree and no over-compression occurs.

Although an arithmetic operation example using the compressive sensing indicated in expression (2) has been described above, another method may be used to determine the solution. For example, another statistical method, such as a maximum likelihood estimation method or a Bayesian estimation method, can be used. Also, the number of separate images 220 is arbitrary, and each wavelength region may also be arbitrarily set. Details of the method for the reconstruction are disclosed in U.S. Patent Application Publication No. 2016/138975. The entire contents disclosed in U.S. Patent Application Publication No. 2016/138975 are hereby incorporated by reference.

<Filter Array Including Fabry-Perot Filters>

Next, a description will be given of an example of a more specific structure of the filter array 100C.

Figure 5:
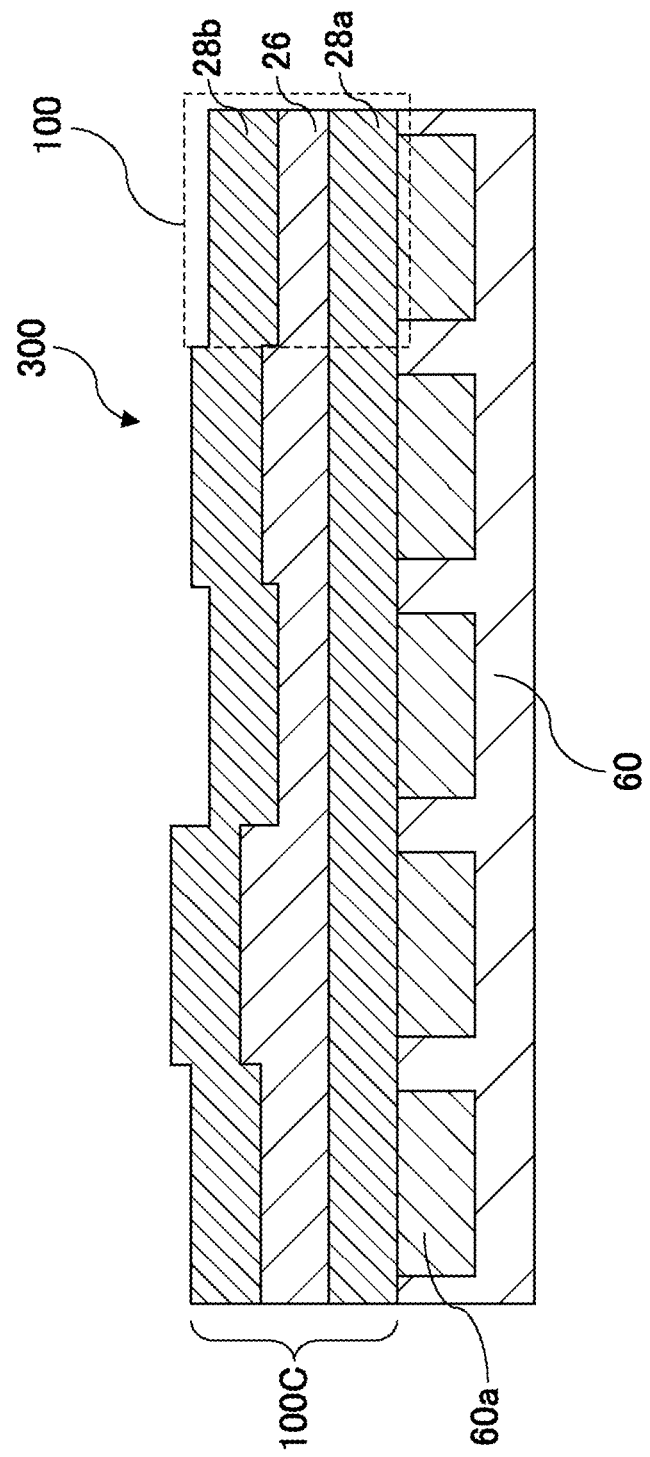
FIG. 5 is a sectional view schematically showing a light detecting device in the exemplary embodiment.

FIG. 5 is a sectional view schematically showing the light detecting device 300 in the exemplary embodiment. The light detecting device 300 includes the filter array 100C and the image sensor 60.

The filter array 100C includes a plurality of filters 100 that is two-dimensionally arrayed. The filters 100 are arrayed in a row and a column, for example, as shown in FIG. 2A. FIG. 5 schematically shows a cross-sectional structure of one of the rows shown in FIG. 2A. Each of the filters 100 has a resonance structure. The resonance structure means a structure in which light with a certain wavelength forms a standing wave and exists stably. The state of the light may be referred to as a "resonant mode". The resonance structure shown in FIG. 5 includes a first reflective layer 28a, a second reflective layer 28b, and an intermediate layer 26 between the first reflective layer 28a and the second reflective layer 28b. The first reflective layer 28a and/or the second reflective layer 28b can be formed of a dielectric multilayer film or a metal thin film. The intermediate layer 26 can be formed of a dielectric or semiconductor that is transparent in a specific wavelength region. The intermediate layer 26 can be formed from, for example, at least one selected from the group consisting of silicon (Si), silicon nitride ($Si_3N_4$), titanium dioxide ($TiO_2$), niobium pentoxide ($Nb_2O_5$), and tantalum pentoxide ($Ta_2O_5$). The refractive index and/or the thickness of the intermediate layer 26 in the filters 100 differ depending on the filter. The transmission spectrum of each of the filters 100 has local maximum values of transmittance at a plurality of wavelengths. The wavelengths respectively correspond to resonant modes whose orders are different from each other in the above-described resonance structure. In the present embodiment, all the filters 100 in the filter array 100C include the above-described resonance structures. The filter array 100C may include filters that do not have the above-described resonance structures. For example, the filter array 100C may include filters, such as transparent filters or neutral density (ND) filters, that do not have wavelength dependency of the light transmittance. In the present disclosure, two or more of the filters 100 each has the above-described resonance structure.

The image sensor 60 includes a plurality of light detection elements 60a. Each of the light detection elements 60a is disposed to face one of the plurality of filters 100. Each of the light detection elements 60a has sensitivity to light in a specific wavelength region. This specific wavelength region corresponds to the above-described target wavelength region W. In the present disclosure, "having sensitivity to light in a certain wavelength region" refers to having substantial sensitivity needed to detect light in the wavelength region. For example, it means that an external quantum efficiency in the wavelength region is 1% or more. An external quantum efficiency of the light detection elements 60a may be 10% or more. The external quantum efficiency of the light detection elements 60a may be 20% or more. The wavelengths at which the light transmittance of each filter 100 takes the local maximum values are all included in the target wavelength region W. The light detection elements 60a may be referred to as "pixels" in the description below.

Besides the example shown in FIG. 5, the filter array 100C and the image sensor 60 may be separated from each other. Even in such a case, each of the light detection elements 60a is disposed at a position where it receives light that has passed through one of the filters. Constituent elements may be disposed so that light that have passed through the filters are incident on the light detection elements 60a, respectively, through a mirror. In this case, each of the light detection elements 60a is not disposed directly below one of the filters.

Herein, the filters 100 having the above-described resonance structures may be referred to as "Fabry-Perot filters". Herein, the portion of a transmission spectrum having a local maximum value may be referred to as a "peak", and a wavelength at which the transmission spectrum has a local maximum value may be referred to as a "peak wavelength".

Next, a description will be given of the transmission spectra of the filters 100, which are Fabry-Perot filters.

In this case, a peak wavelength $\lambda_m$ of the transmission spectrum of the filter 100 is given by:

$$\lambda_m = \frac{2nL}{m}\sqrt{1-\left(\frac{\sin\theta_i}{n}\right)^2} \qquad (3)$$

where, in each filter 100, L represents the thickness of the intermediate layer 26, n represents the refractive index, $\theta_i$ represents the incident angle of light that is incident on the filter 100, and m represents the mode number of the resonant mode and is an integer greater than or equal to 1.

A shortest wavelength in the target wavelength region W is represented by $\lambda_i$, and a longest wavelength therein is represented by $\lambda_e$. Herein, the filter 100 with which the number of m's that satisfy $\lambda_i \leq \lambda_m \leq \lambda_e$ is one is referred to as a "single-mode filter". The filter 100 with which the number of m's that satisfy $\lambda_i \leq \lambda_m \leq \lambda_e$ is two or more is referred to as a "multi-mode filter". An example when the shortest wavelength in the target wavelength region W is given by $\lambda_i = 400$ nm, and the longest wavelength therein is given by $\lambda_e = 700$ nm will be described below.

For example, in the filter 100 with the thickness L=300 nm, the refractive index n=1.0, and the orthogonal incidence $\theta_i = 0°$, the peak wavelength for m=1 is $\lambda_1 = 600$ nm, and the peak wavelength for m≥2 is $\lambda_{m\geq 2} \leq 2300$ nm. Accordingly, this filter 100 is a single-mode filter with which one peak wavelength is included in the target wavelength region W.

On the other hand, when the thickness L is increased to a thickness larger than 300 nm, a plurality of peak wavelengths is included in the target wavelength region W. For example, in the filter 100 with the thickness L=3000 nm, n=1.0, and the orthogonal incidence $\theta_i = 0°$, the peak wavelength for 1≤m≤8 is $\lambda_{i\leq m \leq 8} \leq 750$ nm, the peak wavelength for 9≤m≤15 is 400 nm≤$\lambda_{9\leq m \leq 15}$≤700 nm, and the peak wavelength for m≥16 is $\lambda_{m\geq 16} \leq 375$ nm. Accordingly, this filter 100 is a multi-mode filter with which seven peak wavelengths are included in the target wavelength region W.

Appropriately designing the thickness of the intermediate layer 26 in the filter 100, as described above, makes it possible to realize a multi-mode filter. The refractive index of the intermediate layer 26, instead of the thickness of the intermediate layer 26, in the filter 100 may be appropriately designed. Alternatively, both the thickness and the refractive index of the intermediate layer 26 in the filter 100 may be appropriately designed.

Figure 6:
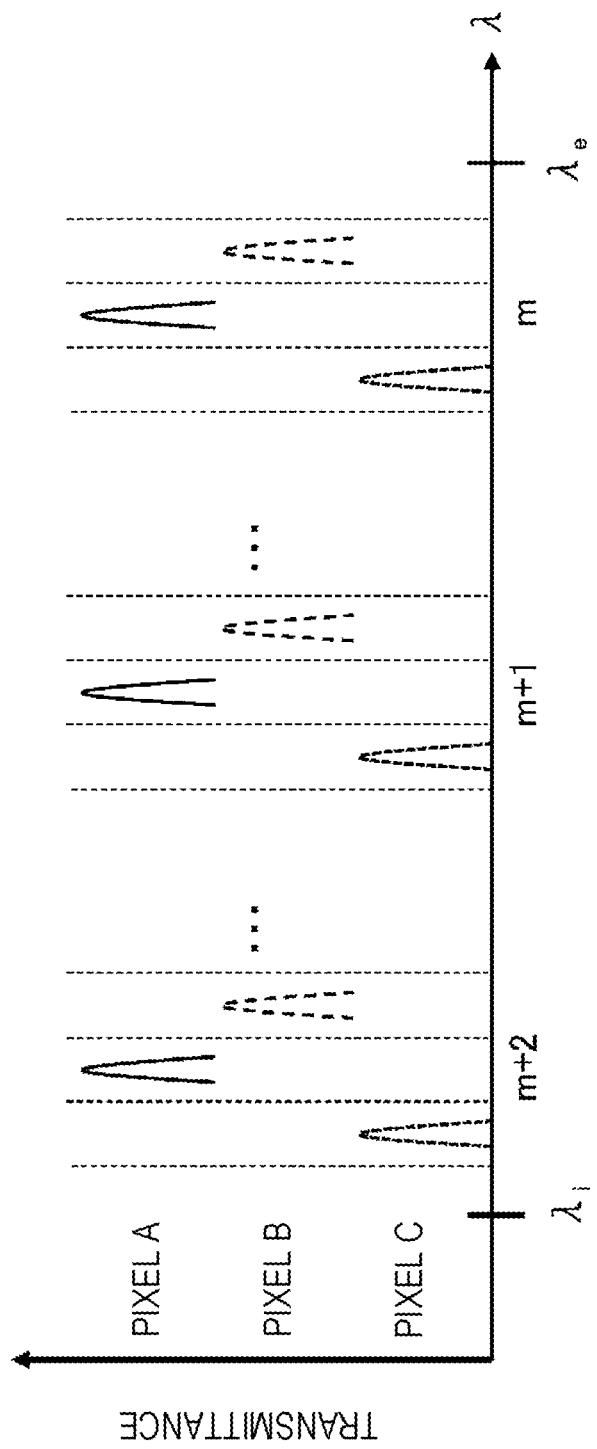
FIG. 6 is a graph schematically showing an example of transmission spectra of pixels.

FIG. 6 is a graph schematically showing an example of transmission spectra at pixels when multi-mode filters whose transmission spectra are different from each other are respectively disposed above the pixels, which are the light detection elements 60a. FIG. 6 illustrates transmission spectra at pixels A, B, and C. The multi-mode filters are designed so that the peak wavelengths are slightly different from one pixel to another. Such a design can be realized by slightly varying the thickness L and/or the refractive index n in expression (3). In this case, in each pixel, a plurality of peaks appears in the target wavelength region W. The mode numbers of the respective peaks are the same among the pixels. The mode numbers of the respective peaks shown in FIG. 6 are m, m+1, and m+2. The light detecting device 300 in the present embodiment can simultaneously detect light with a plurality of peak wavelengths that differ from one pixel to another.

Figure 7:
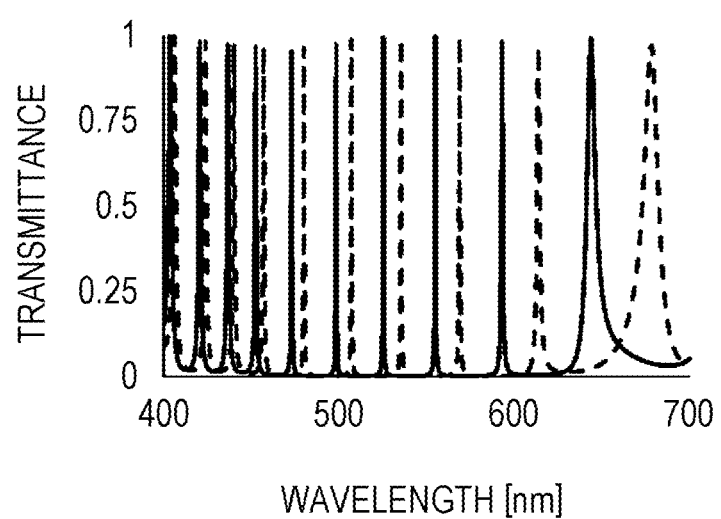
FIG. 7 is a graph showing one example of a calculation result of transmission spectra of a Fabry-Perot filter.

FIG. 7 is a graph showing one example of a calculation result of transmission spectra of the filters 100. In this example, each of the first reflective layer 28a and the second reflective layer 28b in each filter 100 is formed of a dielectric multilayer film in which a $TiO_2$ layer and a silicon dioxide ($SiO_2$) layer are alternately stacked. The intermediate layer 26 in the filter 100 is formed of a $TiO_2$ layer. In the example shown in FIG. 7, the thickness of the intermediate layer 26 corresponding to the transmission spectrum denoted by a solid line is different from the thickness of the intermediate layer 26 corresponding to the transmission spectrum denoted by a dotted line. DiffractMOD based on Rigorous Coupled-Wave Analysis (RCWA) of Synopsys Inc. (formerly, RSoft Inc.) was used for calculating the transmission spectra. As shown in FIG. 7, the plurality of peak wavelengths in the target wavelength region W differs depending on the pixel. As described above, changing the thickness of the intermediate layer 26 in the multi-mode filter 100 for each pixel allows the light detecting device 300 in the present embodiment to simultaneously detect light with a plurality of peak wavelengths that differ for each pixel.

Next, a plurality of separate images 220 reconstructed by a plurality of multi-mode filters will be described in comparison with a plurality of separate images 220 reconstructed by a plurality of single-mode filters.

Figure 8B:
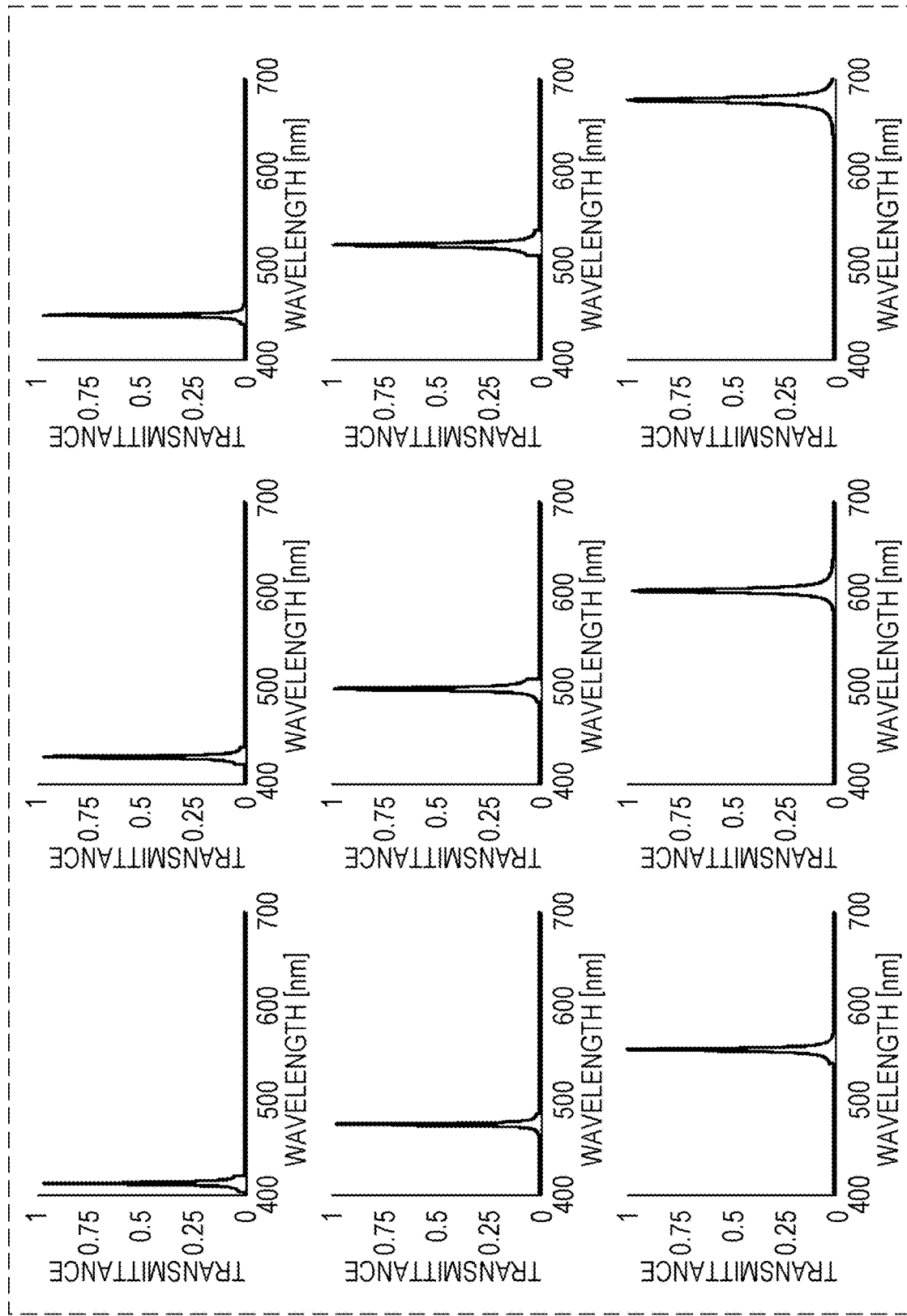
FIG. 8B includes graphs showing respective transmission spectra of nine types of single-mode filter.

FIG. 8A has graphs showing respective transmission spectra of nine types of multi-mode filter. FIG. 8B has graphs showing respective transmission spectra of nine types of single-mode filter. In the example shown in FIG. 8A, the transmission spectrum of each multi-mode filter exhibits eight or nine peaks in the target wavelength region W. In the example shown in FIG. 8B, the transmission spectrum of each single-mode filter exhibits one peak in the target wavelength region W. The filter array 100C includes, for example, one million filters 100 that are two-dimensionally arrayed. The million filters 100 randomly include nine types of multi-mode filter shown in FIG. 8A. Alternatively, the million filters 100 randomly includes nine types of single-mode filter shown in FIG. 8B. Because of the random arrangement, adjacent filters may be of the same type of filter. Such cases, however, are thought to be rare. Accordingly, a major problem does not occur.

Figure 8C:
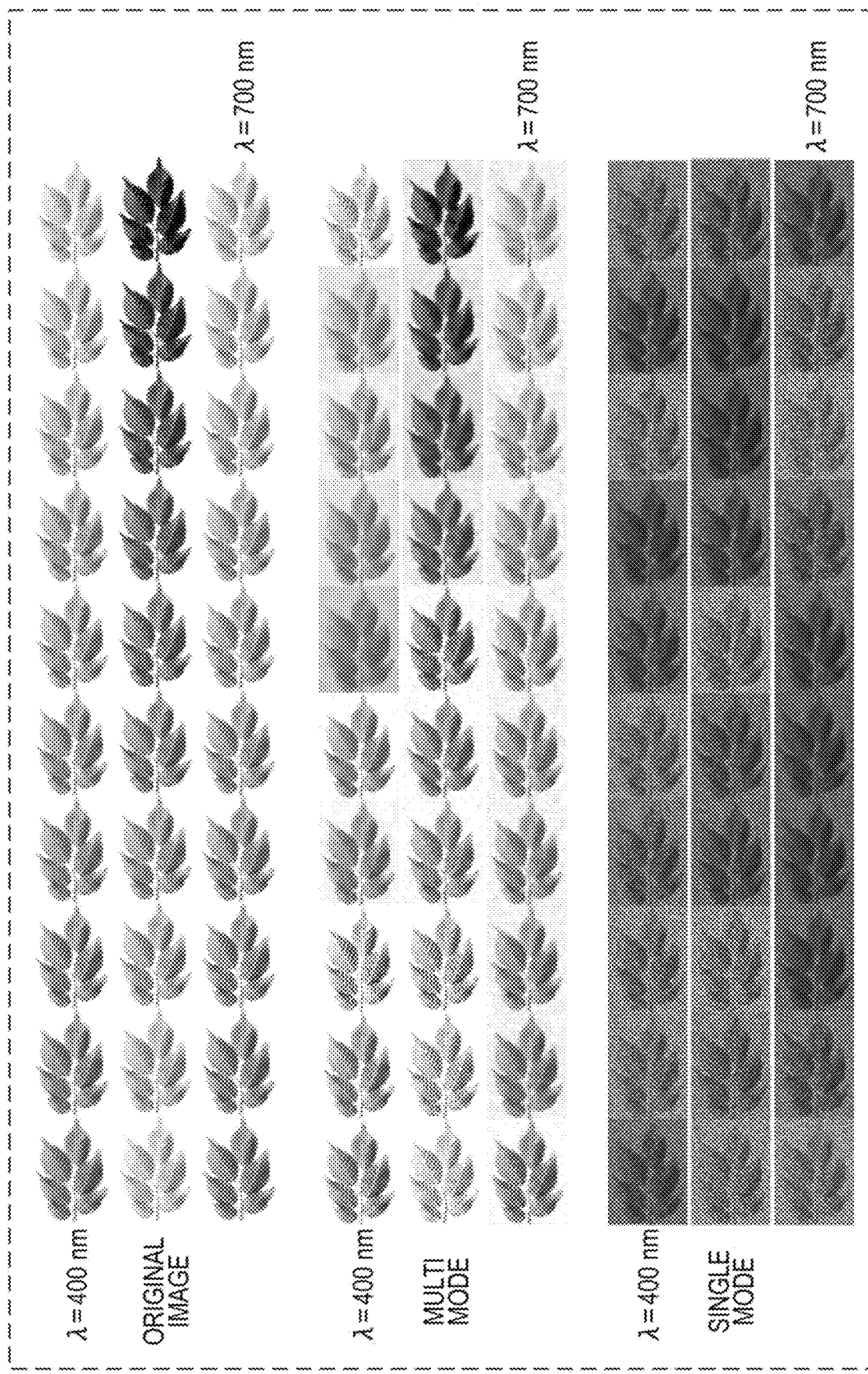
FIG. 8C is a view showing original images and two examples of reconstructed separate images.

FIG. 8C is a view showing original images and two examples of a plurality of reconstructed separate images 220. The upper stage in FIG. 8C shows original images. The middle stage in FIG. 8C shows an example of a plurality of separate images 220 reconstructed via the nine types of multi-mode filter shown in FIG. 8A. The lower stage in FIG. 8C shows an example of a plurality of separate images 220 reconstructed via the nine types of single-mode filter shown in FIG. 8B. Thirty images in each of the upper stage, the middle stage, and the lower stage were respectively acquired by detecting light in 30 wavelength regions. The 30 wavelength regions were obtained by equally dividing the target wavelength region W from 400 nm to 700 nm into 30 regions in increments of 10 nm. For example, the first, second, and third images from the top left in each of the upper stage, the middle stage, and the lower stage were obtained by respectively detecting light in a wavelength region from 400 nm to 410 nm, light in a wavelength region from 410 nm to 420 nm, and light in a wavelength region from 420 nm to 430 nm, respectively. In the example shown in FIG. 8C, the images in the lower stage are darker than the images in the middle stage. This is thought to be because the amount of light that passed through the single-mode filters is smaller than the amount of light that passed through the multi-mode filters.

Figure 8D:
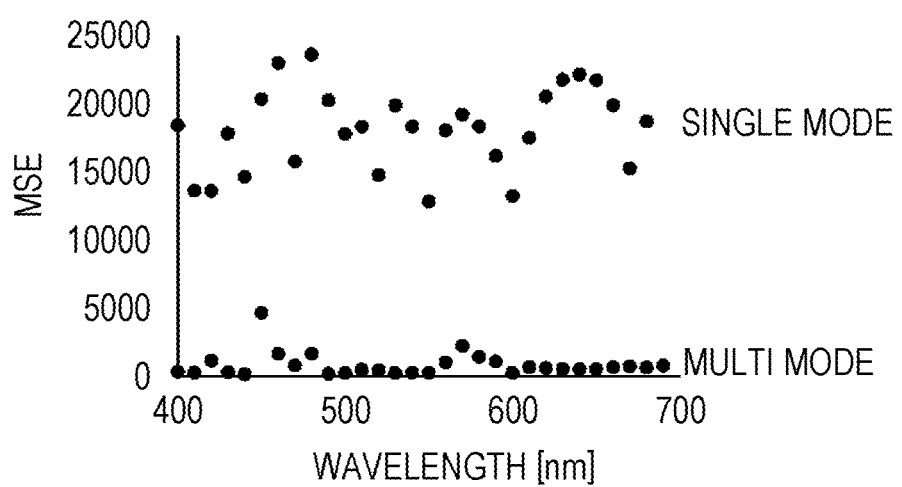
FIG. 8D is a graph showing a calculation result of mean squared errors between the original image and each reconstructed separate image.

FIG. 8D is a graph showing a calculation result of mean squared errors (MSEs) between the original image and each reconstructed separate image 220. The mean squared errors are calculated using expression (4):

$$MSE = \frac{1}{N \cdot M} \sum_{i=1}^{N} \sum_{j=1}^{M} (I'_{i,j} - I_{i,j})^2 \quad (4)$$

In this case, N and M are the number of picture elements in a vertical direction and the number of picture elements in a lateral direction, respectively. $I_{i,j}$ is a picture element value of the original image at the picture element at position (i,j). $I'_{i,j}$ is a picture element value in each reconstructed separate image 220 at the picture element at position (i,j).

As shown in FIG. 8D, the MSE between the original image and each separate image 220 reconstructed via the multi-mode filters is sufficiently smaller than the MSE between the original image and each separate image 220 reconstructed via the single-mode filters. Accordingly, in the light detecting device 300 in the present embodiment, the original images can be accurately reproduced with the plurality of separate images 220 reconstructed via the multi-mode filters. The original images cannot be accurately reproduced with the plurality of separate images 220 reconstructed via the single-mode filters.

As described above, in the light detecting system 400 in the present embodiment, the signal processing circuit 200 shown in FIG. 1 generates image data including information of a plurality of wavelengths, based on signals output from the plurality of pixels 60a. The image data includes data representing the separate images 220 spectrally separated for the respective wavelengths.

The number of picture elements in each of the separate images 220 is larger than M/N, where N presents the number of separate images 220, and M represents the number of pixels. In the example shown in the middle stage in FIG. 8C, the number of picture elements is equal to M. Thus, even when the images are spectrally separated for the respective wavelengths, the light detecting system 400 in the present embodiment can suppress a reduction in the resolution of each of the plurality of separate images 220.

Next, a description will be given of an influence that the refractive indices of the intermediate layers 26 in the filters 100 have on the wavelength resolution of the light detecting device 300.

Figure 9:
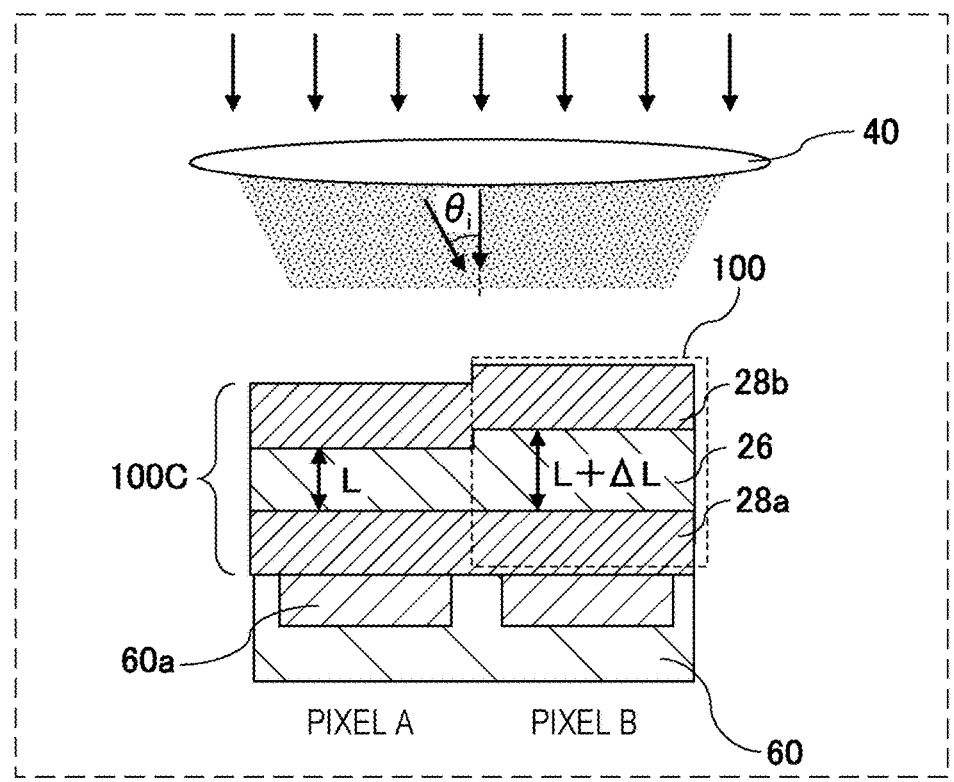
FIG. 9 is a diagram schematically showing an example of two Fabry-Perot filters whose thicknesses of intermediate layers are the closest in the filter array.

As described above, the filters 100 in the filter array 100C include the intermediate layers 26 having thicknesses that are different from each other, as shown in FIG. 5. FIG. 9 is a diagram schematically showing an example of two filters 100 whose thicknesses of the intermediate layers 26 are the closest in the filter array 100C. In the example shown in FIG. 9, the filter 100 in which the thickness of the intermediate layer 26 is L and the filter 100 in which the thickness of the intermediate layer 26 is L+ΔL are disposed adjacent to each other. The pixel for which the filter 100 in which the thickness of the intermediate layer 26 is L is disposed and the pixel for which the filter 100 in which the thickness of the intermediate layer 26 is L+ΔL is disposed are referred to as "pixel A" and "pixel B", respectively. In the filter array 100C, even when two filters 100 shown in FIG. 9 are disposed away from each other, the following discussion holds true.

In the example shown in FIG. 9, the light detecting device 300 includes the optical system 40. When an optical image from a target object passes through the center of the lens included in the optical system 40, the optical image is orthogonally incident on the filter 100. On the other hand, when an optical image from a target object passes through a portion other than the center of the lens included in the optical system 40, the optical image is obliquely incident on the filter 100 at a finite incident angle. The finite incident angle is determined by a numerical aperture NA of the optical system 40. That is, the minimum value of the incident angle of light that is incident on the filter array 100C from the optical system 40 is 0°, and the maximum value of the incident angle is $\sin^{-1}(NA)°$. Accordingly, in the transmission spectrum of the filter 100, in accordance with expression (3), the peak wavelength shifts toward the short wavelength side as the incident angle $\theta_i$ increases.

Figure 10:
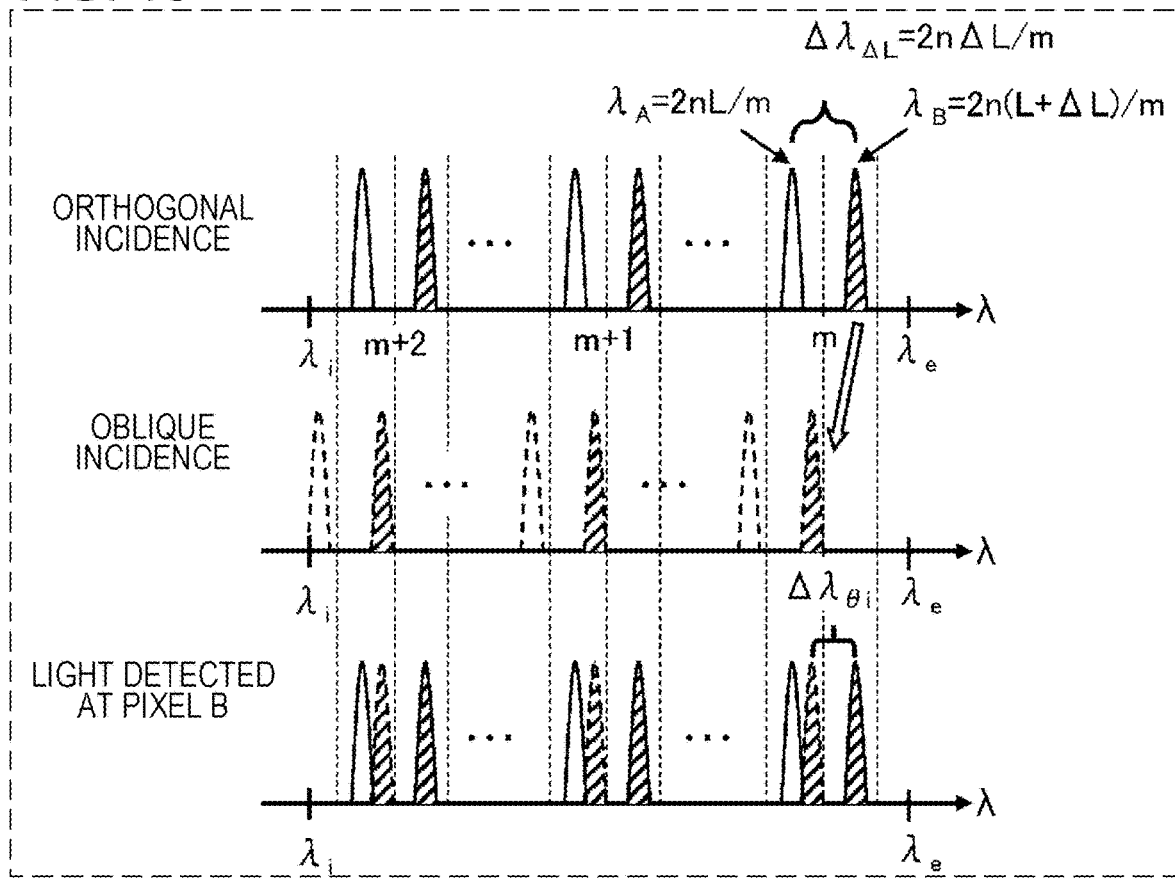
FIG. 10 is a graph for describing the wavelengths of light detected by two pixels when light is orthogonally or obliquely incident on a Fabry-Perot filter.

FIG. 10 has graphs for describing the wavelengths of light detected by pixels A and B when light is orthogonally or obliquely incident on the filter 100. The upper stage in FIG. 10 shows peaks of light detected by pixels A and B in the case of orthogonal incidence. The middle stage in FIG. 10 shows peaks of light detected by pixels A and B in the case of oblique incidence. The lower stage in FIG. 10 shows peaks of light detected by pixel B in the case of oblique incidence. In the description below, the peak wavelength of the mode number m for light detected by pixel A is referred to as a "peak wavelength of pixel A", and the peak wavelength of the mode number m for light detected by pixel B is referred to as a "peak wavelength of pixel B". In the orthogonal incidence, the peak wavelength of pixel A is $\lambda_A=2nL/m$, and the peak wavelength of pixel B is $\lambda_B=2n(L+\Delta L)/m$. The difference ΔL between the thicknesses of the intermediate layers 26 in the two filters 100 shown in FIG. 9 is the smallest of combinations of two arbitrary filters 100 in the filter array 100C. Accordingly, an interval $\Delta\lambda_{\Delta L}=2n\Delta L/m$ of the peak wavelengths of pixels A and B is the smallest of the combinations of two arbitrary pixels in the image sensor 60. The interval of the peak wavelengths of pixels A and B corresponds to the wavelength resolution of the light detecting device 300.

On the other hand, in the oblique incidence, the peak wavelength shifts toward the short wavelength side. An amount $\Delta\lambda_{\theta i}$ of shift of the peak wavelength in the oblique incidence is given by expression (5):

$$\Delta\lambda_{\theta_i} = \frac{2nL}{m}\left[1 - \sqrt{1 - \left(\frac{\sin\theta_i}{n}\right)^2}\right] \quad (5)$$

Thus, for $\Delta\lambda_{\theta i} \geq \Delta\lambda_{\Delta L}$, there is a possibility that the peak wavelength of pixel B in the oblique incidence matches the peak wavelength of pixel A in the orthogonal incidence. In the example shown in FIG. 9, both light of the orthogonal incidence and light of the oblique incidence are simultaneously detected by pixel B. Accordingly, for $\Delta\lambda_{\theta i} \geq \Delta\lambda_{\Delta L}$, light that should be detected by pixel A is falsely detected by pixel B.

From the above discussion, it follows that a condition that the false detection does not occur is $\Delta\lambda_{\theta i} < \Delta\lambda_{\Delta L}$. When $\Delta\lambda_{\theta i} < \Delta\lambda_{\Delta L}$ is modified, expression (6) below is obtained.

$$\Delta L > L\left[1 - \sqrt{1 - \left(\frac{\sin\theta_i}{n}\right)^2}\right] \quad (6)$$

In addition, the condition that the false detection does not occur may be set to $\Delta\lambda_{\theta i} < \Delta\lambda_{\Delta L}/2$. In the following description, the wavelength region in which light with a peak wavelength at the mode number m is detected by pixel A is referred to as "wavelength region A", and the wavelength region in which light with a peak wavelength at the mode number m is detected by pixel B is referred to as "wavelength region B". When the upper limit of wavelength region A and the lower limit of wavelength region B are both set to $(\lambda_A+\lambda_B)/2=\Delta\lambda_A+\Delta\lambda_{\Delta L}/2$, the peak wavelength of image B does not enter wavelength region A even for oblique incidence, because of $\Delta\lambda_{\theta i}<\Delta\lambda_{\Delta L}/2$. This allows the signal processing circuit 200 to process a peak wavelength in wavelength region A as the peak wavelength of pixel A and to process a peak wavelength in wavelength region B as the peak wavelength of pixel B, regardless of the incident angle $\theta_i$. As a result, occurrence of the false detection can be more reduced than in the case of expression (6). When $\Delta\lambda_{\theta i}<\Delta\lambda_{\Delta L}/2$ is modified, expression (7) below is obtained.

$$\Delta L > 2L\left[1 - \sqrt{1 - \left(\frac{\sin\theta_i}{n}\right)^2}\right] \quad (7)$$

According to expressions (6) and (7), increasing the refractive index n of the intermediate layer 26 makes it possible to reduce the influences of the incident angle $\theta_i$. As a result, it is possible to improve the wavelength resolution of the light detecting device 300.

Figure 11A:
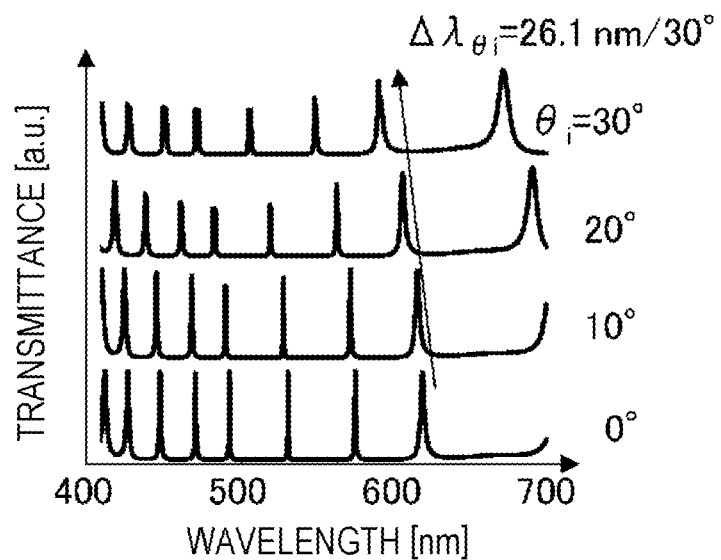
FIG. 11A is a graph showing incident angle dependency of a transmission spectrum of a Fabry-Perot filter including an intermediate layer with a refractive index=1.5.
Figure 11B:
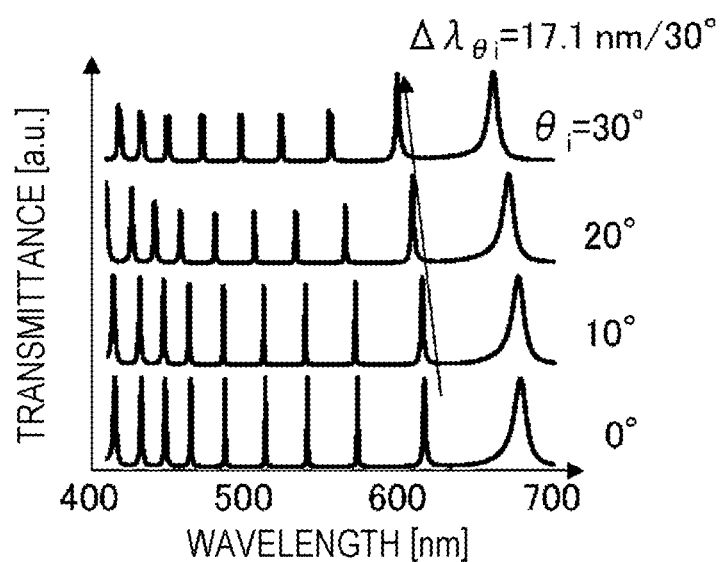
FIG. 11B is a graph showing incident angle dependency of a transmission spectrum of a Fabry-Perot filter including an intermediate layer with a refractive index=2.35.

FIG. 11A and FIG. 11B are graphs showing incident angle dependency of the transmission spectra of the filter 100 including the intermediate layer 26 with the refractive index n=1.5 and the filter 100 including the intermediate layer 26 with the refractive index n=2.35, respectively. In the example shown in FIG. 11A, when the incident angle e changes from 0° to 30°, the peak wavelength shifts by 26.1 nm. In the example shown in FIG. 11B, when the incident angle changes from 0° to 30°, the peak wavelength shifts by 17.1 nm. That is, increasing the refractive index of the intermediate layer 26 makes it possible to reduce the amount of shift in the peak wavelength, the shift being caused by a change in the incident angle $\theta_i$. Accordingly, appropriately designing the refractive index of the intermediate layer 26 in accordance with expressions (6) and (7) makes it possible to improve the wavelength resolution of the light detecting device 300.

A difference between the light detecting device 300 in the present embodiment and the device disclosed in U.S. Pat. No. 9,929,206 will be described next.

U.S. Pat. No. 9,929,206 discloses a device in which a plurality of single-mode filters is two-dimensionally arrayed. The peak wavelengths of the plurality of single-mode filters differ from one filter to another. When the number of peaks in the transmission spectra of the filter array in which the plurality of single-mode filters is two-dimensionally arrayed is represented by N, the spatial resolution of each separate image decreases to 1/N even when a plurality of separate images is reconstructed using the filter array. Accordingly, the original images cannot be accurately reproduced with the separate images, unlike the example shown in the middle stage in FIG. 8C. Thus, the device disclosed in U.S. Pat. No. 9,929,206 cannot provide an advantage that is analogous to that of the light detecting device 300 in the present embodiment.

Also, in the device disclosed in Japanese Unexamined Patent Application Publication (Translation of PCT Application) No. 2015-501432, each of a plurality of sensors in a sensor array does not receive light with a plurality of wavelengths corresponding to peak wavelengths of a multi-mode filter and also does not reconstruct separate images 220 by using information of the plurality of wavelengths. Accordingly, the device disclosed in Japanese Unexamined Patent Application Publication (Translation of PCT Application) No. 2015-501432 cannot provide an advantage that is analogous to that of the light detecting device 300 in the present embodiment.

Modifications of the light detecting device 300 shown in FIG. 5 will be described next.

FIGS. 12A to 12F are views schematically showing modifications of the light detecting device 300 shown in FIG. 5.

As shown in FIG. 12A, in the filter array 100C, the filters 100 may be divided. All the filters 100 do not have to be divided. Some of the filters 100 may be divided.

Figure 12B:
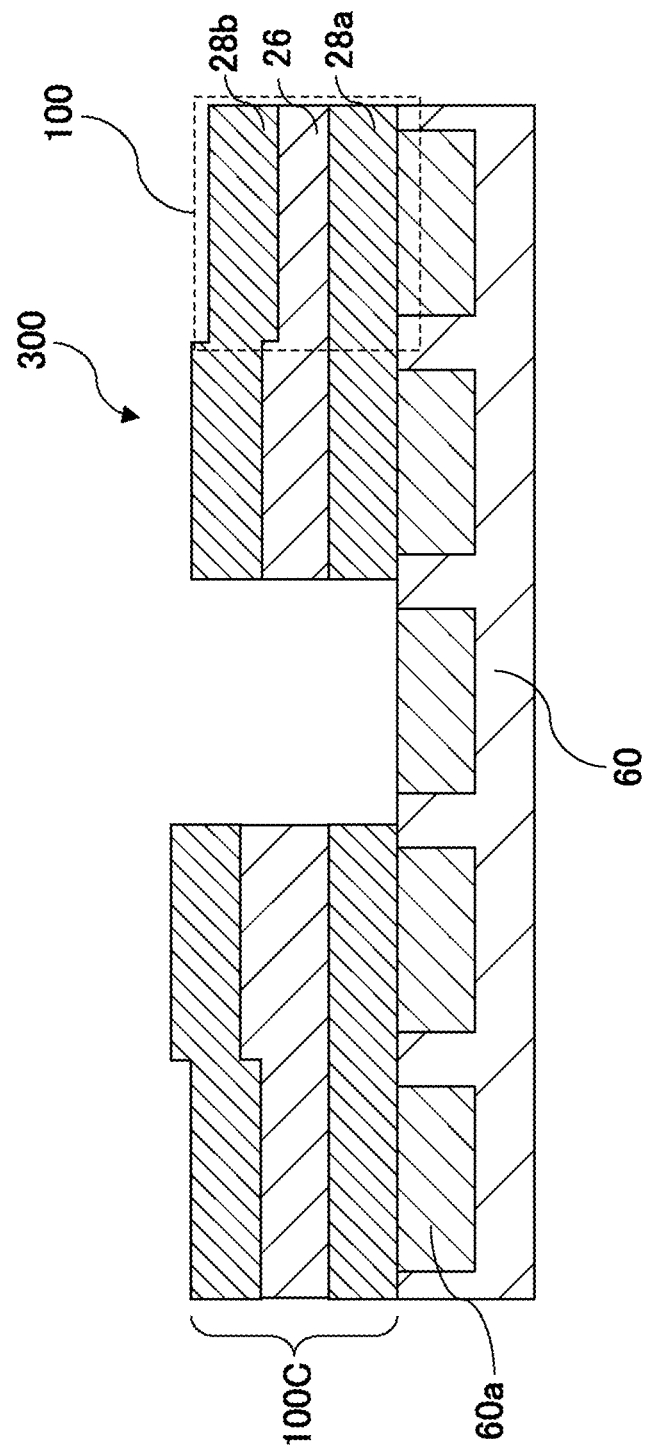
FIG. 12B is a view schematically showing a second modification of the light detecting device shown in FIG. 5.

As shown in FIG. 12B, the filters 100 do not have to be disposed above some of the pixels. In other words, in the filter array 100C, at least one of the filters 100 may be transparent.

As shown in FIG. 12C, space may be provided between the filter array 100C and the image sensor 60. In other words, the filter array 100C and the image sensor 60 may be separated from each other with space being interposed therebetween.

As shown in FIG. 12D, one filter 100 may be disposed across a plurality of pixels. In other words, the intermediate layer 26 may be continuously provided across two or more pixels. The first reflective layer 28a and/or the second reflective layer 28b may be continuously provided across two or more pixels.

As shown in FIGS. 12E and 12F, a transparent layer 27 may be disposed to planarize level differences on the filter array 100C. In other words, the filter array 100C may further include a transparent layer 27 that planarizes level differences on two or more filters 100 having the above-described resonance structures. In the example shown in FIG. 12E, level differences exist at upper surfaces of the second reflective layers 28b in the filter array 100C. In the example shown in FIG. 12F, level differences exist at lower surfaces of the first reflective layers 28a in the filter array 100C. Planarizing level differences on two or more filters 100 by using the transparent layer 27 facilitates that another member is disposed on the transparent layer 27.

As shown in FIGS. 12E and 12F, a plurality of microlenses 40a may be disposed on the filter array 100C. Each of the microlenses 40a is disposed on one of the filters 100. In other words, the filter array 100C includes two or more microlenses 40a. Each of the two or more microlenses 40a is disposed on one of the two or more filters 100 having the above-described resonance structures. Concentrating incident light by using the two or more microlenses 40a makes it possible to efficiently detect light.

<Band-Pass Filter>

A band-pass filter may be used to pass some of a plurality of peak wavelengths in a transmission spectrum of the filter 100 and to remove the remainder. Redundant descriptions of those described above are not given hereinafter.

Figure 13:
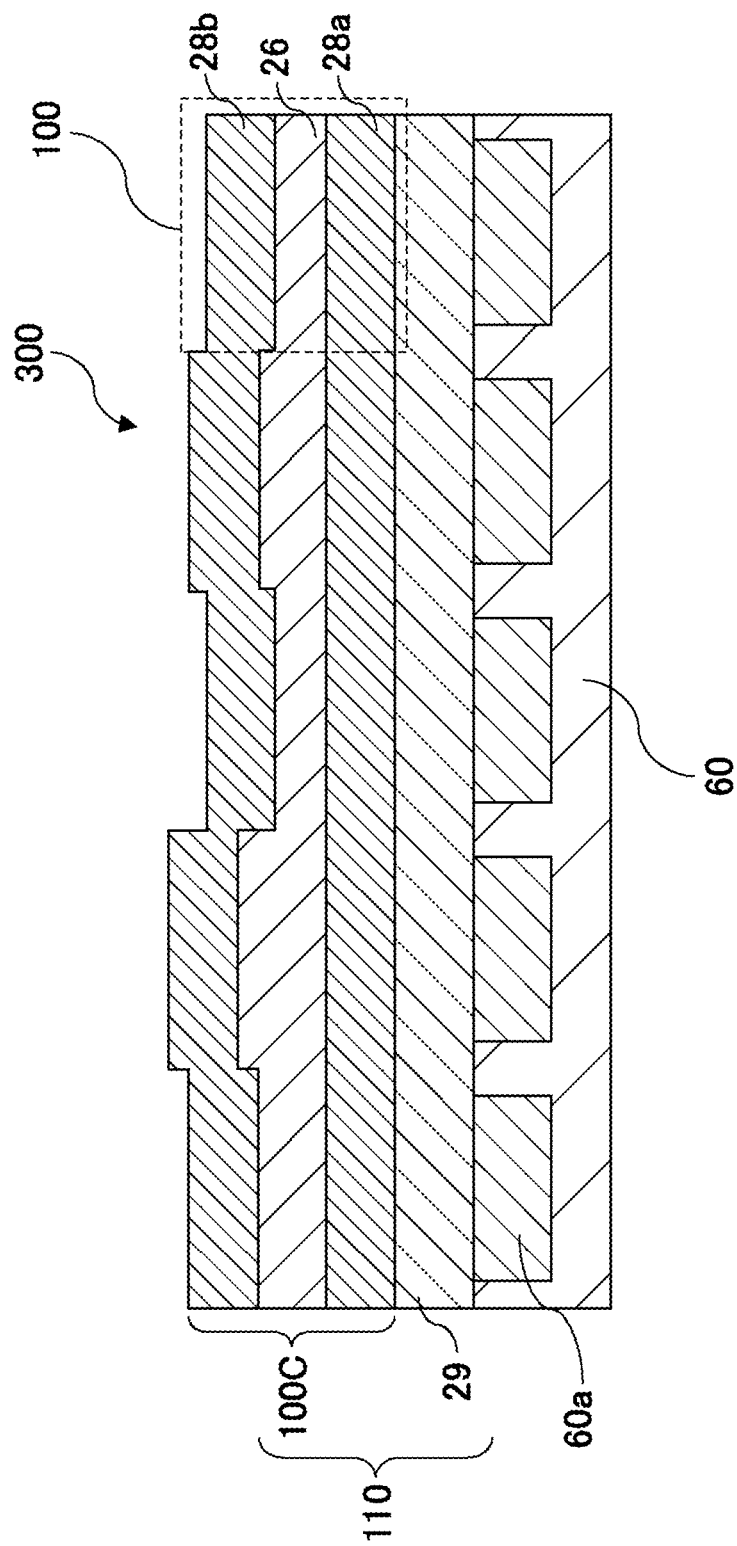
FIG. 13 is a view schematically showing a light detecting device in another exemplary embodiment.

FIG. 13 is a view schematically showing a light detecting device 300 in another exemplary embodiment. The light detecting device 300 further includes a band-pass filter 29, in addition to the filter array 100C and the image sensor 60. In the example shown in FIG. 13, the band-pass filter 29 is disposed between the filter array 100C and the image sensor 60 in the example shown in FIG. 5. Herein, the filter array 100C and the band-pass filter 29 may be collectively referred to as an "optical filter 110". That is, the optical filter 110 includes the filter array 100C and the band-pass filter 29.

In the filter array 100C, the transmission spectrum of each of the filters 100 has local maximum values at three or more peak wavelengths in a specific wavelength region of the image sensor 60. Each of the filters 100 does not have to be a Fabry-Perot filter.

The band-pass filter 29 overlaps the entire filter array 100C when viewed in a direction orthogonal to the filter array 100C. The band-pass filter 29 passes light with two or more peak wavelengths of three or more peak wavelengths in the specific wavelength region. The band-pass filter 29 removes light with one or more peak wavelengths of the three or more peak wavelengths in the specific wavelength region. Since light with two or more peak wavelengths is passed, an advantage of the multi-mode filters in the filter 100 is exploited.

In summary, the band-pass filter 29 passes light in a partial wavelength region included in the specific wavelength region of the image sensor 60. The partial wavelength region includes two or more peak wavelengths of the three or more peak wavelengths and do not include one or more peak wavelengths of the three or more peak wavelengths.

Besides the example shown in FIG. 13, each transmission spectrum of two or more filters of the plurality of filters 100 may have local maximum values at three or more peak wavelengths in a specific wavelength region of the image sensor 60. The band-pass filter 29 may overlap the two or more filters when viewed in a direction orthogonal to the filter array 100C. Of the plurality of filters 100, at least one filter other than the two or more filters may be transparent. Of the plurality of filters 100, the transmittance of at least one filter other than the two or more filters may have one or more local maximum values in a specific wavelength region.

Although, in the example shown in FIG. 13, the filter array 100C and the band-pass filter 29 are in contact with each other, they may be separated from each other. Although, in the example shown in FIG. 13, the optical filter 110 and the image sensor 60 are in contact with each other, they may be separated from each other.

An example of peak wavelength removal performed by the band-pass filter 29 will be described next.

Figure 14A:
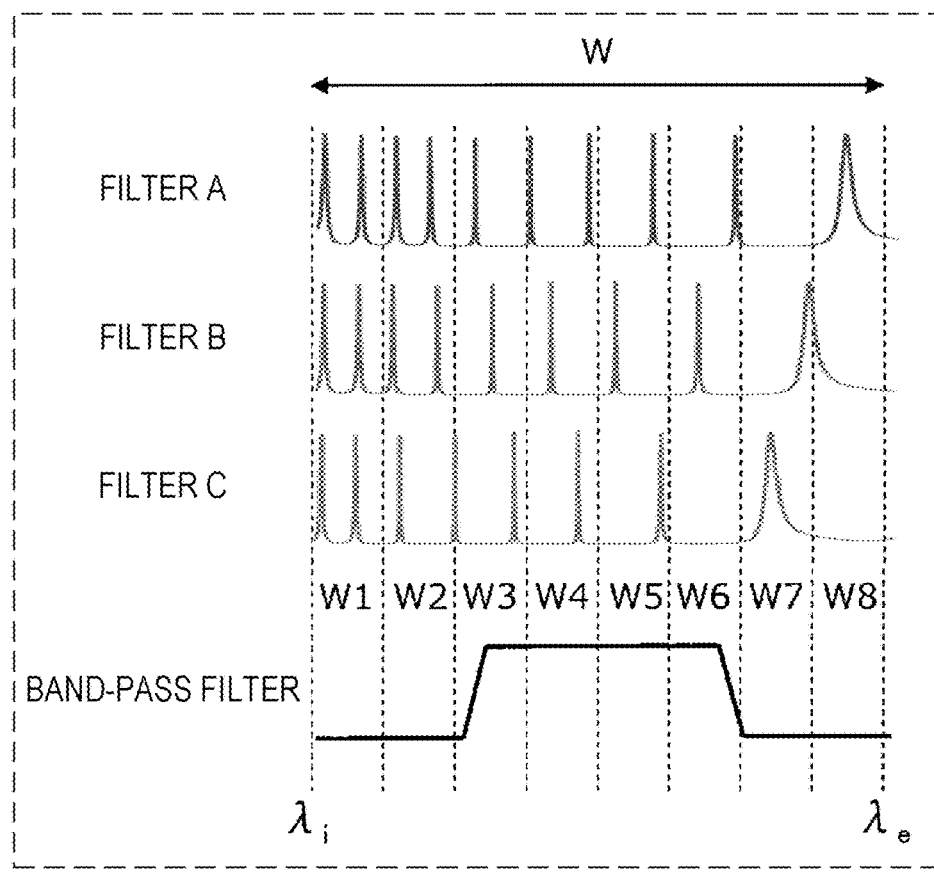
FIG. 14A is a graph schematically showing an example of the transmission spectra of filters A, B, and C and an example of the transmission spectrum of a band-pass filter.

FIG. 14A is a diagram schematically showing an example of transmission spectra of filters A, B, and C and an example of a transmission spectrum of the band-pass filter 29. In the example shown in FIG. 14A, the specific wavelength region of the image sensor 60 corresponds to the target wavelength region W shown in FIG. 3A. The target wavelength region W is divided into wavelength regions W1 to W8. Filters A, B, and C each have three or more peak values at different wavelengths in the specific wavelength region in the transmission spectrum. The numbers of peak values in filters A, B, and C are ten, nine, and eight, respectively. The band-pass filter 29 passes light with the wavelength regions W3 to W6 in the specific wavelength region and removes light with the wavelength regions W1 to W2 and the wavelength regions W7 and W8.

Figure 14B:
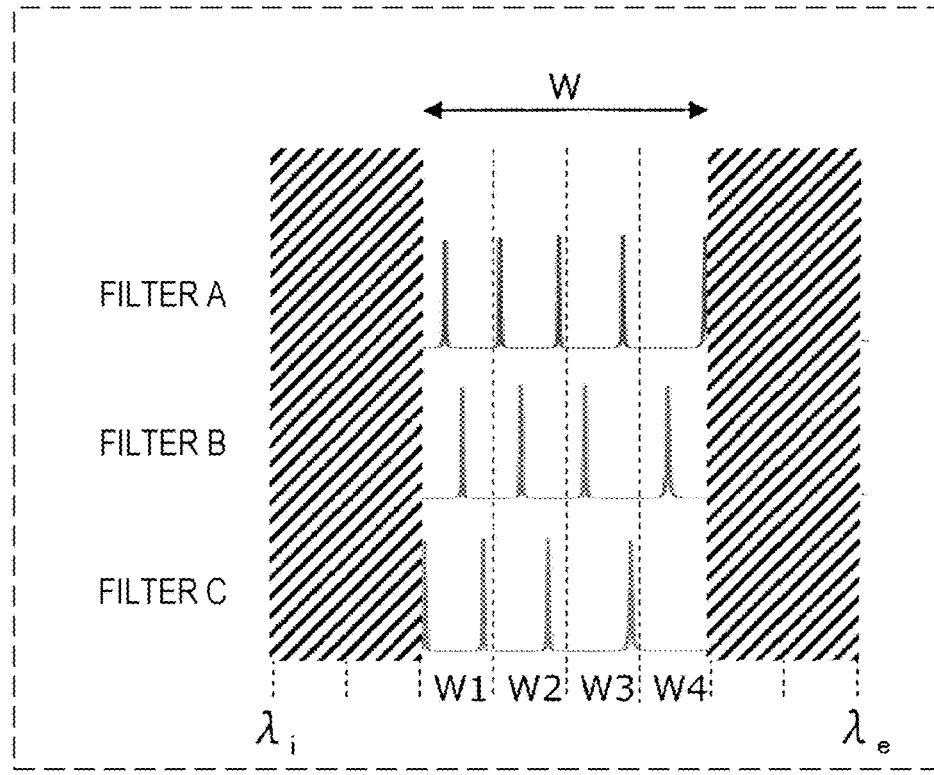
FIG. 14B is a diagram schematically showing an example of the transmission spectrum of one filter constituted by a set of each of filters A, B, and C and a band-pass filter.

FIG. 14B is a diagram schematically showing an example of a transmission spectrum of one filter constituted by a set of each of filters A, B, and C and the band-pass filter 29. As shown in FIG. 14B, the transmission spectrum has peak wavelengths in a partial wavelength region in the specific wavelength region. The partial wavelength region corresponds to the target wavelength region W shown in FIG. 3A. The target wavelength region W that is narrower than the specific wavelength region is divided into wavelength regions W1 to W4. The wavelength regions W1 to W4 shown in FIG. 14B respectively correspond to the wavelength regions W3 to W6 shown in FIG. 14A.

When comparison is made between the examples shown in FIGS. 14A and 14B, the band-pass filter 29 reduces the target wavelength region W to thereby make it possible to reduce the number of regions divided in the target wavelength region W. This makes it possible to reduce the sizes of the matrix H and the vector f in expressions (1) and (2). As a result, the signal processing circuit 200 shown in FIG. 1 can process image signals output from the image sensor 60 with a small amount of arithmetic operation load and can generate and output a plurality of pieces of image data in a short period of time. Each of the plurality of pieces of image data is image data for one of the plurality of wavelength regions in the above-described partial wavelength region. The plurality of pieces of image data represents a plurality of reconstructed separate images 220.

The band-pass filter 29 may pass light with a plurality of discrete wavelength regions in the specific wavelength region.

Figure 15A:
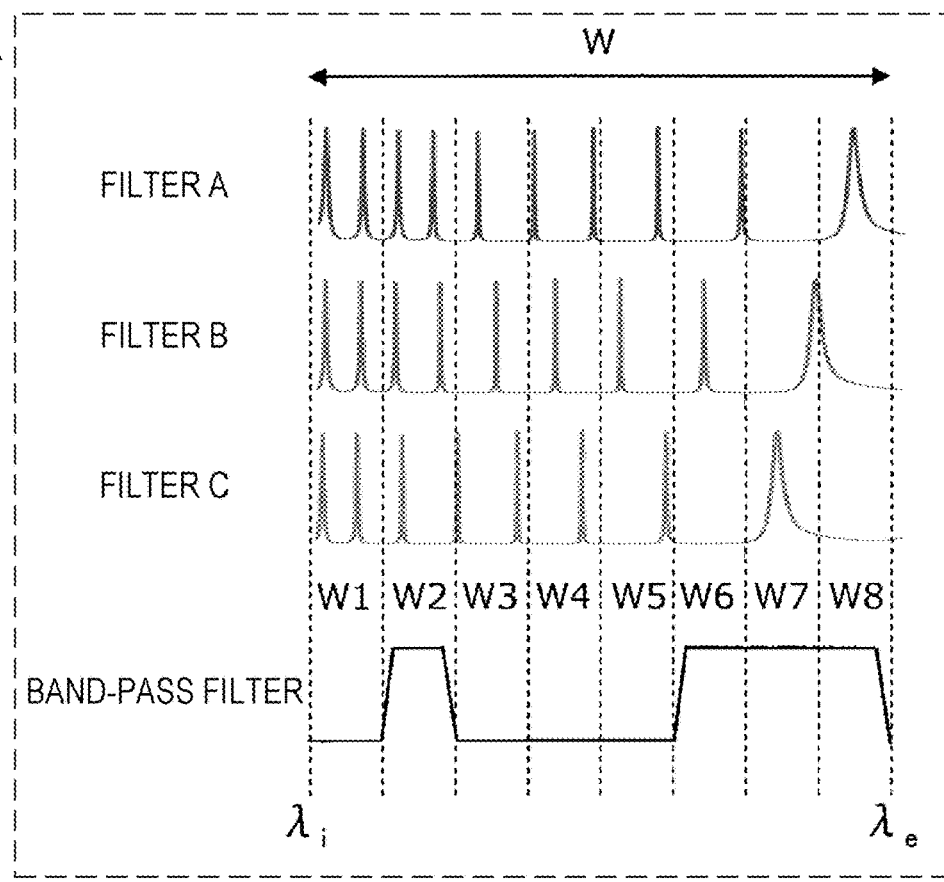
FIG. 15A is a diagram showing a modification of the example shown in FIG. 14A.

FIG. 15A is a diagram showing a modification of the example shown in FIG. 14A. The transmission spectrum of the band-pass filter 29 shown in FIG. 15A differs from the transmission spectrum of the band-pass filter 29 shown in FIG. 14A. The band-pass filter 29 shown in FIG. 15A passes light with wavelength regions W2 and W6 to W8 in the specific wavelength region and removes light with wavelength regions W1 and W3 to W5.

Figure 15B:
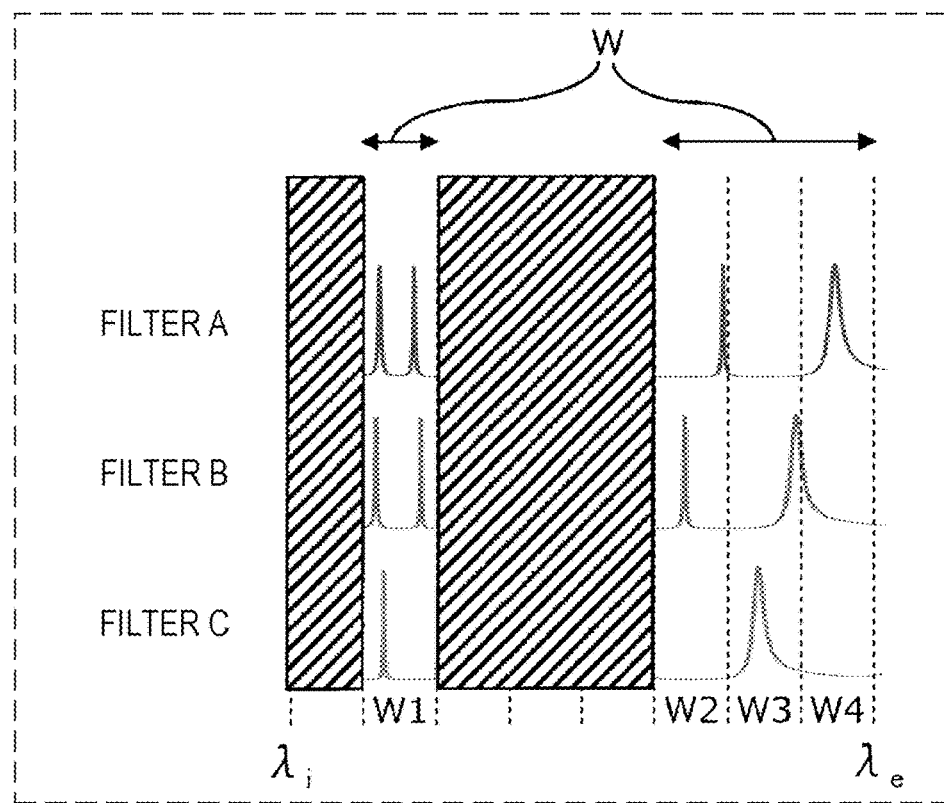
FIG. 15B is a diagram showing a modification of the example shown in FIG. 14B.

FIG. 15B is a diagram showing a modification of the example shown in FIG. 14B. As shown in FIG. 15B, the transmission spectrum has peak wavelengths in two discrete wavelength regions in the specific wavelength region. The two discrete wavelength regions correspond to the target wavelength region W shown in FIG. 3A. The target wavelength region W that is narrower than the specific wavelength region is divided into wavelength regions W1 to W4. Of the two discrete wavelength regions, one wavelength region is the wavelength region W1, and the other wavelength region corresponds to the wavelength regions W2 to W4. The wavelength regions W1 to W4 shown in FIG. 15B correspond respectively to the wavelength regions W2 and W6 to W8 shown in FIG. 15A. Even in this case, separate images 220 can be reconstructed in a short time. Of the plurality of peak wavelengths shown in FIG. 15A, one or more peak wavelengths that are not included in the target wavelength region W shown in FIG. 15B can also be said to be located between two or more peak wavelengths included in the target wavelength region W.

Next, modifications of the light detecting device 300 shown in FIG. 13 will be described.

FIGS. 16A to 16D are views schematically showing modifications of the light detecting device 300 shown in FIG. 13.

Figure 16A:
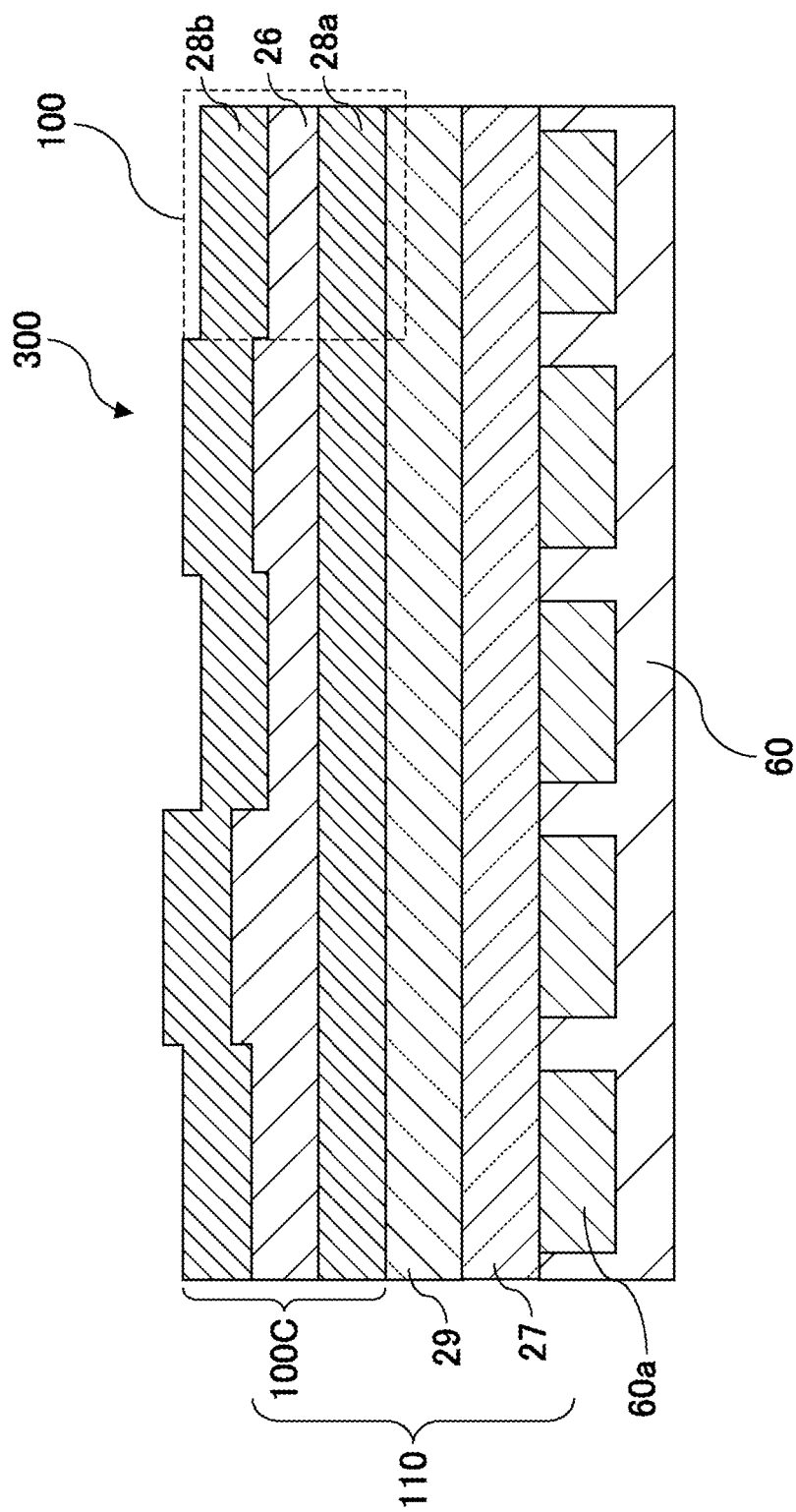
FIG. 16A is a diagram schematically showing a first modification of the light detecting device shown in FIG. 13.

As shown in FIG. 16A, the transparent layer 27 may be disposed between the band-pass filter 29 and the image sensor 60 shown in FIG. 13. As shown in FIG. 16A, the optical filter 110 may include the filter array 100C, the band-pass filter 29, and the transparent layer 27.

Figure 16B:
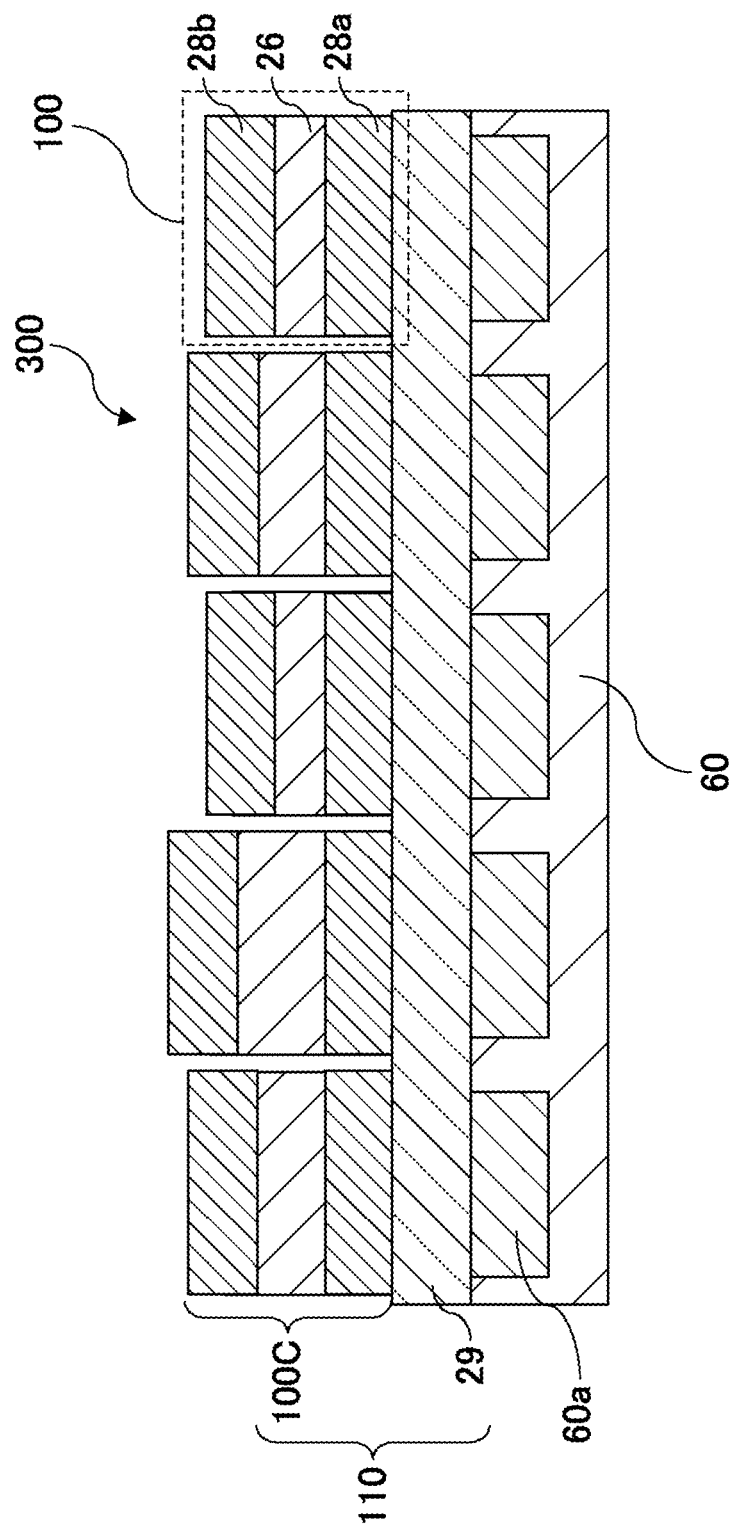
FIG. 16B is a diagram schematically showing a second modification of the light detecting device shown in FIG. 13.

In the filter array 100C shown in FIG. 13, the filters 100 may also be divided, as shown in FIG. 16B.

Level differences on the filter array 100C shown in FIG. 13 may be planarized with the transparent layer 27, as shown in FIG. 16C. The band-pass filter 29 may be disposed on the transparent layer 27. The plurality of microlens 40a may be disposed on the band-pass filter 29. As shown in FIG. 16C, the optical filter 110 may include the filter array 100C, the band-pass filter 29, and the transparent layer 27. The optical filter 110 may further include the plurality of microlens 40a.

Figure 16D:
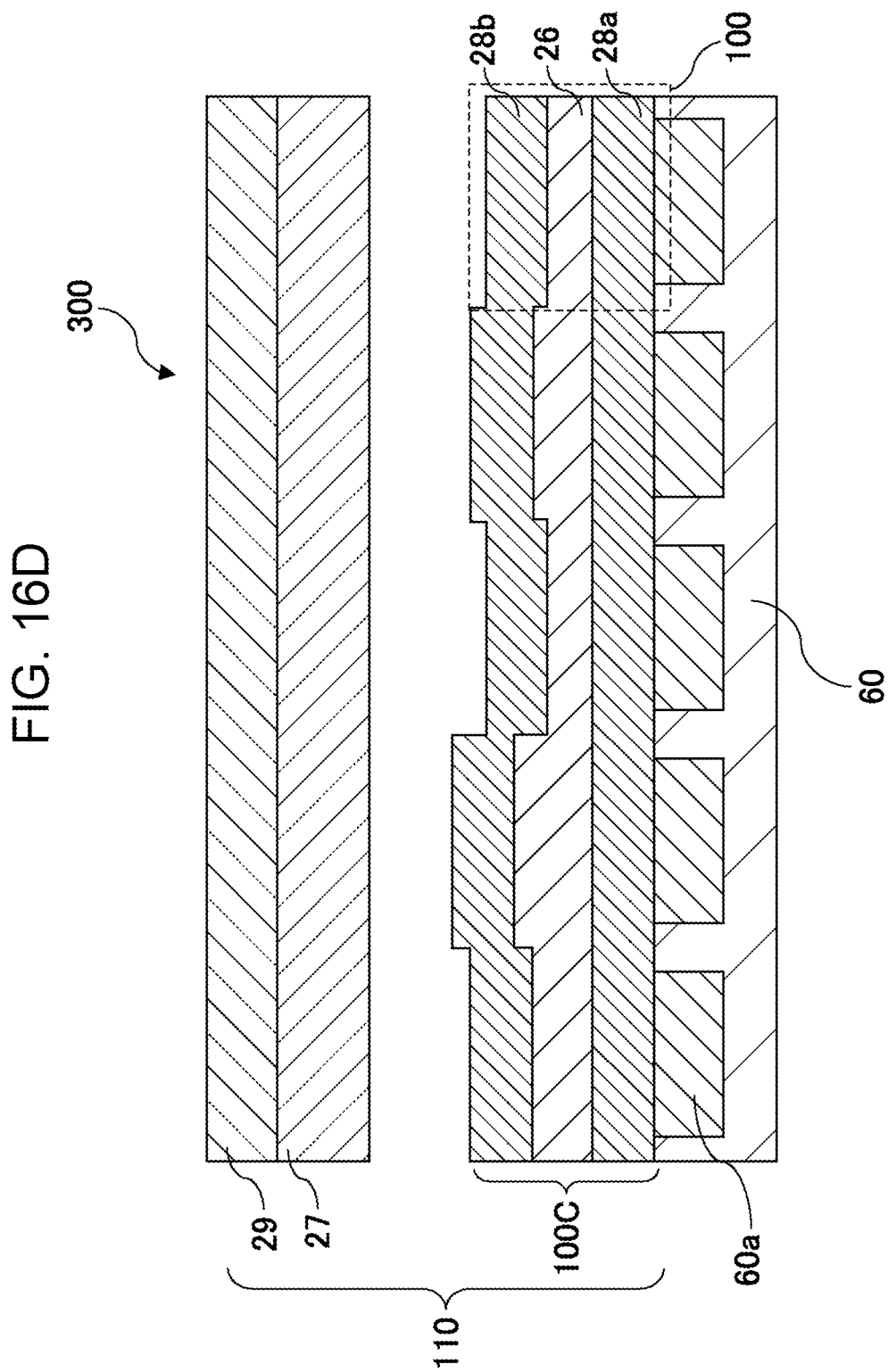
FIG. 16D is a diagram schematically showing a fourth modification of the light detecting device shown in FIG. 13.

As shown in FIG. 16D, the band-pass filter 29 disposed on the transparent layer 27 and the filter array 100C disposed on the image sensor 60 may be separated from each other. As shown in FIG. 16D, the optical filter 110 may include the filter array 100C, the band-pass filter 29, and the transparent layer 27.

In addition, the band-pass filter 29 may be disposed in or on each of the configurations shown in FIGS. 12A to 12F, to configure a light detecting device 300 other than the examples shown in FIGS. 16A to 16D. Also, the geometric relationship between the filter array 100C and the band-pass filter 29 is as follows. The above-described two or more filters 100 in the filter array 100C may be disposed on an optical path of light that passes through the band-pass filter 29. Conversely, the band-pass filter 29 may be disposed on an optical path of light that passes through the above-described two or more filters 100 in the filter array 100C.

The optical filter, the light detecting device, and the light detecting system in the present disclosure are useful for, for example, cameras and measurement equipment that acquire multi-wavelength two-dimensional images. The optical filter, the light detecting device, and the light detecting system in the present disclosure can also be applied to sensing for living bodies, medical care, and beauty care, inspection systems for foreign matter and residual agricultural chemicals in food, remote sensing systems, vehicle-mounted sensing systems, and so on.

What is claimed is:

1. An optical filter comprising:
    a filter array including a plurality of filters that is two-dimensionally arrayed, the plurality of filters including a first filter and a second filter, a transmission spectrum of each of the first filter and the second filter having local maximum values of transmittance at three or more wavelengths included in a first wavelength region; and
    a band-pass filter that passes light in a second wavelength region including two or more wavelengths of the three or more wavelengths and not including one or more wavelengths of the three or more wavelengths,
    wherein the filter array and the band-pass filter are disposed so that (a) the band-pass filter is located on an optical path of transmitted light that passes through the first filter and the second filter or (b) the first filter and the second filter are located on an optical path of transmitted light that passes through the band-pass filter.

2. The optical filter according to claim 1, wherein
each of the first filter and the second filter includes a first reflective layer, a second reflective layer, an intermediate layer between the first reflective layer and the second reflective layer and has a resonance structure having a plurality of resonant modes, orders of the plurality of resonant modes being different from each other;

at least one selected from the group consisting of a refractive index and a thickness of the intermediate layer in the first filter differs from the at least one selected from the group consisting of a refractive index and a thickness of the intermediate layer in the second filter;

the plurality of resonant modes includes three resonant modes; and the three or more wavelengths correspond to the three resonant modes, respectively.

3. The optical filter according to claim 2,
wherein each of the plurality of filters has the resonance structure.

4. The optical filter according to claim 1,
wherein the filter array further includes a transparent layer for planarizing a level difference between a surface of the first filter and a surface of the second filter.

5. The optical filter according to claim 1,
wherein at least one of the plurality of filters is transparent.

6. The optical filter according to claim 1, wherein
the plurality of filters includes a third filter that is different from the first filter and the second filter, and
a transmission spectrum of the third filter has one or more local maximum values of transmittance.

7. The optical filter according to claim 1,
wherein the filter array is separated from the band-pass filter.

8. The optical filter according to claim 1,
wherein the filter array is in contact with the band-pass filter.

9. The optical filter according to claim 1,
wherein the band-pass filter overlaps all of the filter array when viewed in a direction orthogonal to the filter array.

10. The optical filter according to claim 1,
wherein the one or more wavelengths not included in the second wavelength region are located between a longest wavelength and a shortest wavelength of the two or more wavelengths included in the second wavelength region.

11. A light detecting device comprising:
the optical filter according to claim 1; and
an image sensor including a plurality of light detection elements, each having sensitivity to light in the first wavelength region.

12. The light detecting device according to claim 11,
wherein the optical filter is in contact with the image sensor.

13. The light detecting device according to claim 11,
wherein the optical filter is separated from the image sensor.

14. The light detecting device according to claim 11,
further comprising optical system including at least one lens,
wherein the optical system, the optical filter and the image sensor are arranged in this order such that light enters from the optical system toward the image sensor.

15. A light detecting system comprising:
the light detecting device according to claim 11; and
a signal processing circuit,
wherein, based on a signal output from the image sensor, the signal processing circuit generates and outputs image data including information of a plurality of wavelengths included in the second wavelength region.

16. The light detecting system according to claim 15,
wherein the image data includes data representing images spectrally separated for the plurality of wavelengths.

17. The light detecting system according to claim 16,
wherein the number of picture elements included in each of the images is larger than M/N, where N represents the number of images, and M represents the number of light detection elements.

18. The light detecting system according to claim 17,
wherein the number of picture elements is equal to the number of light detection elements.

* * * * *